US012592287B2

(12) United States Patent
Liu et al.

(10) Patent No.: US 12,592,287 B2
(45) Date of Patent: Mar. 31, 2026

(54) MEMORY, MEMORY SYSTEM, PROGRAM METHOD OF MEMORY, AND ELECTRONIC APPARATUS

(71) Applicant: YANGTZE MEMORY TECHNOLOGIES CO., LTD., Wuhan (CN)

(72) Inventors: Hongtao Liu, Wuhan (CN); Ying Huang, Wuhan (CN); Lei Guan, Wuhan (CN); Lei Jin, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 12 days.

(21) Appl. No.: 18/614,118

(22) Filed: Mar. 22, 2024

(65) Prior Publication Data

US 2025/0191668 A1 Jun. 12, 2025

(30) Foreign Application Priority Data

Dec. 12, 2023 (CN) .......................... 202311707067.4

(51) Int. Cl.
　　 *G11C 16/34* 　　(2006.01)
　　 *G11C 29/12* 　　(2006.01)
　　 *G11C 29/42* 　　(2006.01)
(52) U.S. Cl.
　　 CPC .... *G11C 16/3404* (2013.01); *G11C 29/12005* (2013.01); *G11C 29/42* (2013.01); *G11C 2029/1204* (2013.01)

(58) Field of Classification Search
　　 CPC .............. G11C 29/12005; G11C 29/42; G11C 2029/1204; G11C 16/3404
　　 See application file for complete search history.

(56) References Cited

U.S. PATENT DOCUMENTS

| | | | | |
|---|---|---|---|---|
| 9,933,963 | B1 * | 4/2018 | Alhussien | G06F 12/0253 |
| 11,500,706 | B2 * | 11/2022 | Kim | G11C 29/028 |
| 12,222,800 | B2 * | 2/2025 | Papandreou | G06F 3/0679 |
| 2009/0248952 | A1 * | 10/2009 | Radke | G06F 12/0246 |
| | | | | 711/E12.001 |
| 2014/0334228 | A1 * | 11/2014 | Kim | G06F 11/1072 |
| | | | | 365/185.03 |
| 2017/0371744 | A1 * | 12/2017 | Sehgal | G11C 16/10 |
| 2018/0189135 | A1 * | 7/2018 | Naik | G11C 29/028 |
| 2019/0348143 | A1 * | 11/2019 | Zeng | G06F 11/1048 |
| 2020/0234780 | A1 * | 7/2020 | Papandreou | G11C 16/3418 |
| 2021/0065816 | A1 * | 3/2021 | Lee | G11C 16/34 |
| 2022/0319622 | A1 * | 10/2022 | Bhardwaj | G06F 3/0679 |
| 2024/0054046 | A1 * | 2/2024 | Khayat | G11C 29/52 |

* cited by examiner

*Primary Examiner* — Steve N Nguyen
(74) *Attorney, Agent, or Firm* — BAYES PLLC

(57) ABSTRACT

The present disclosure discloses a memory, a memory system, a program method of a memory, and an electronic apparatus, relating to the technical field of memories. The memory includes a memory array and a peripheral circuit, wherein the memory array includes memory cells; the peripheral circuit is configured to perform a first program operation on the memory cells, perform a read operation on a memory page through a preset read voltage, and perform a second program operation on the memory cells in a case where a fail bit count read based on the read voltage meets a preset requirement.

20 Claims, 16 Drawing Sheets

801 Perform a first program operation on memory cells

802 Perform a read operation on the memory cells through a preset read voltage

803 Perform a second program operation on the memory cells, in a case where a fail bit count (FBC) read based on the read voltage meets a preset requirement

1401

Send a first program instruction and first program data to the memory

1402

Send a second program instruction and second program data to the memory in response to reception of first information fed back by the memory

1600

MEMORY, MEMORY SYSTEM, PROGRAM METHOD OF MEMORY, AND ELECTRONIC APPARATUS

CROSS-REFERENCE TO RELATED APPLICATIONS

This application claims the benefit of priority to Chinese Application No. 202311707067.4, filed on Dec. 12, 2023, the content of which is incorporated herein by reference in its entirety.

TECHNICAL FIELD

The present disclosure relates to the technical field of memories, and particularly to a memory, a memory system, a program method of a memory, and an electronic apparatus.

BACKGROUND

A 3-Dimension (3D) memory includes a plurality of memory cells, and according to an amount of data able to be stored by the memory cells, the memory cells may be classified into a Single-Level Cell (SLC), a Multi-Level Cell (MLC), a Trinary-Level Cell (TLC), and a Quad-Level cell (QLC), etc. In the related technology, each memory page typically undergoes program write a plurality of times, and a solution of error correction processing during a program process is a pressing issue to be addressed.

SUMMARY

According to one aspect of the present disclosure, a memory is provided. The memory may include a memory array with memory cells. The memory may include a peripheral circuit. The peripheral circuit may be configured to perform a first program operation on the memory cells. The peripheral circuit may be configured to perform a read operation on the memory cells through a preset read voltage. The peripheral circuit may be configured to, when a fail bit count (FBC) read based on the preset read voltage meets a preset requirement, perform a second program operation on the memory cells.

In some implementations, the peripheral circuit may be further configured to perform the read operation on the memory cells through a plurality of preset read voltages. In some implementations, the peripheral circuit may be further configured to read the fail bit count based on the plurality of preset read voltages.

In some implementations, the peripheral circuit may be further configured to read a number of memory cells between two adjacent preset read voltages of the plurality of preset read voltages. In some implementations, the peripheral circuit may be further configured to determine the fail bit count based on the number of memory cells between the two adjacent preset read voltages.

In some implementations, the peripheral circuit may be further configured to, when a difference between the number of memory cells between the two adjacent preset read voltages and a first preset number is less than or equal to a first difference threshold, perform the second program operation on the memory cells. In some implementations, the peripheral circuit may be further configured to, when the difference between the number of memory cells between the two adjacent preset read voltages and the first preset number is greater than the first difference threshold, receive error-corrected data obtained after error correction of a program result of the first program operation.

In some implementations, the peripheral circuit may be further configured to, using the plurality of preset read voltages as a default read level, read a number of memory cells within a preset offset range of the default read level. In some implementations, the peripheral circuit may be further configured to determine the fail bit count based on the number of memory cells within the preset offset range of the default read level.

In some implementations, the peripheral circuit may be further configured to, when the number of memory cells within the preset offset range of the default read level is less than or equal to a second preset number, perform the second program operation on the memory cells. In some implementations, the peripheral circuit may be further configured to, when the number of memory cells within the preset offset range of the default read level is greater than the second preset number, receive error-corrected data obtained after error correction of a program result of the first program operation.

In some implementations, the peripheral circuit may be further configured to receive first program data from a memory interface, and perform the first program operation on the memory cells according to the first program data to obtain n programmed states, where n may be a positive integer. In some implementations, the peripheral circuit may be further configured to, when the fail bit count read based on the preset read voltage meets the preset requirement, receive second program data from the memory interface, and perform the second program operation on the memory cells according to the first program data and the second program data to obtain m programmed states, n≤m.

In some implementations, the peripheral circuit may be further configured to, when the fail bit count read based on the preset read voltage does not meet the preset requirement, receive the first program data after error correction with memory error correction code (ECC) from the memory interface. In some implementations, the peripheral circuit may be further configured to receive the second program data from the memory interface, and perform the second program operation on the memory cells according to the first program data after the error correction with the ECC and the second program data to obtain the m programmed states.

According to another aspect of the present disclosure, a memory system is provided. The memory system may include a memory with a memory array that includes memory cells. The memory system may include a memory controller configured to send first program data to the memory. The memory may be configured to perform a first program operation on the memory cells according to the first program data, perform a read operation on the memory cells through a preset read voltage, and, when a fail bit count read based on the preset read voltage meets a preset requirement, send first information to the memory controller. The memory controller may be further configured to receive the first information and send second program data to the memory. The memory may be further configured to perform a second program operation on the memory cells according to the first program data and the second program data.

In some implementations, the memory may be further configured to perform the read operation on the memory cells through a plurality of preset read voltages. In some implementations, the memory may be further configured to read the fail bit count based on the plurality of preset read voltages.

In some implementations, the memory may be further configured to read a number of memory cells between two adjacent preset read voltages of the plurality of preset read voltages. In some implementations, the memory may be further configured to determine the fail bit count based on the number of memory cells between the two adjacent preset read voltages.

In some implementations, the memory may be further configured to, when a difference between the number of memory cells between the two adjacent preset read voltages and a first preset number is less than or equal to a first difference threshold, perform the second program operation on the memory cells. In some implementations, the memory may be further configured to, when the difference between the number of memory cells between the two adjacent preset read voltages and the first preset number is greater than the first difference threshold, receive error-corrected data obtained after error correction of a program result of the first program operation.

In some implementations, the memory may be further configured to, using the plurality of preset read voltages as a default read level, read a number of memory cells within a preset offset range of the default read level. In some implementations, the memory may be further configured to determine the fail bit count based on the number of memory cells within the preset offset range of the default read level.

In some implementations, the memory may be further configured to, when the number of memory cells within the preset offset range of the default read level is less than or equal to a second preset number, perform the second program operation on the memory cells. In some implementations, the memory may be further configured to, when the number of memory cells within the preset offset range of the default read level is greater than the second preset number, receive error-corrected data obtained after error correction of a program result of the first program operation.

In some implementations, the memory may be further configured to, when the fail bit count read based on the preset read voltage does not meet the preset requirement, send a program result of the first program data to the memory controller. In some implementations, the memory controller may be further configured to perform error correction with ECC on the program result, and send the first program data after the error correction with the ECC and the second program data to the memory. In some implementations, the memory may be further configured to perform the second program operation on the memory cells according to the first program data after the error correction with the ECC and the second program data.

According to a further aspect of the present disclosure, a method of programming a memory is provided. The method may include performing a first program operation on memory cells. The method may include performing a read operation on the memory cells through a preset read voltage. The method may include, when a fail bit count read based on the preset read voltage meets a preset requirement, performing a second program operation on the memory cells.

In some implementations, the performing the read operation on the memory cells through the preset read voltage may include performing the read operation on the memory cells through a plurality of preset read voltages.

In some implementations, the performing the read operation on the memory cells through a plurality of preset read voltages may include reading a number of memory cells between two adjacent preset read voltages of the plurality of preset read voltages.

In some implementations, the performing the second program operation on the memory cells in a case where the fail bit count read based on the preset read voltage meets the preset requirement may include, when a difference between the number of memory cells between two adjacent preset read voltages and a first preset number is less than or equal to a first difference threshold, performing the second program operation on the memory cells. In some implementations, the performing the second program operation on the memory cells in a case where the fail bit count read based on the preset read voltage meets the preset requirement may include, when the difference between the number of memory cells between two adjacent preset read voltages and the first preset number is greater than the first difference threshold, receiving error-corrected data obtained after error correction of a program result of the first program operation.

In some implementations, the performing the read operation on the memory cells through a plurality of preset read voltages may include using the plurality of preset read voltages as a default read level, reading a number of memory cells within a preset offset range of the default read level.

In some implementations, the performing the second program operation on the memory cells when the fail bit count read based on the preset read voltage meets a preset requirement may include, when the number of memory cells within the preset offset range of the default read level is less than or equal to a second preset number, performing the second program operation on the memory cells. In some implementations, the performing the second program operation on the memory cells when the fail bit count read based on the preset read voltage meets a preset requirement may include, when the number of memory cells within the preset offset range of the default read level is greater than the second preset number, receiving error-corrected data obtained after error correction of a program result of the first program operation.

In some implementations, the performing the first program operation on memory cells may include receiving first program data from a memory interface, and performing the first program operation on the memory cells according to the first program data to obtain n programmed states, where n may be a positive integer. In some implementations, the performing the second program operation on the memory cells when the fail bit count read based on the preset read voltage meets a preset requirement may include, when the fail bit count read based on the read voltage meets the preset requirement, receiving second program data from the memory interface, and performing the second program operation on the memory cells according to the first program data and the second program data to obtain m programmed states, $n \leq m$.

In some implementations, when the fail bit count read based on the preset read voltage does not meet the preset requirement, the method may include receiving the first program data after error correction with ECC from the memory interface. In some implementations, the method may include receiving the second program data from the memory interface, and performing the second program operation on the memory cells according to the first program data after the error correction with the ECC and the second program data to obtain the m programmed states.

According to still another aspect of the present disclosure, a method of programming a memory is provided. The method may include sending a first program instruction and first program data to the memory. The first program instruction may be to instruct the memory to perform a first program operation on the first program data. The method may include sending a second program instruction and second program data to the memory in response to reception of first information fed back by the memory. The second program instruction may be to instruct the memory to perform a second program operation on the first program data and the second program data, and the first information is to indicate that the first program operation of the memory meets a preset requirement.

In some implementations, in response to reception of a program result of the first program data and second information fed back by the memory, the method may include performing error correction with ECC on the program result to obtain error-corrected first program data. In some implementations, the method may include sending a third program instruction, the second program data, and the error-corrected first program data to the memory. In some implementations, the third program instruction may be to instruct the memory to perform the second program operation on the error-corrected first program data and the second program data.

According to yet a further aspect of the present disclosure, a method of programming a memory is provided. The method may include receiving a first program instruction and first program data that are sent by a memory controller. The method may include transmitting the first program instruction and the first program data to the memory. The first program instruction may be to instruct the memory to perform a first program operation on the first program data. The method may include receiving first information fed back by the memory. The first information may be to indicate that the first program operation of the memory meets a preset requirement. The method may include transmitting the first information to the memory controller and receiving a second program instruction and second program data that are sent by the memory controller. The method may include transmitting the second program instruction and the second program data to the memory. The second program instruction may be to instruct the memory to perform a second program operation on the first program data and the second program data.

In some implementations, the method may include receiving a program result of the first program data and second information fed back by the memory. In some implementations, the second information may be to instruct to perform error correction on the program result of the memory. In some implementations, the method may include sending the second information and the program result of the first program data to the memory controller. In some implementations, the method may include receiving a third program instruction, the second program data, and error-corrected first program data that are sent by the memory controller. In some implementations, the method may include sending the third program instruction, the second program data, and the error-corrected first program data to the memory. In some implementations the third program instruction may be to instruct the memory to perform the second program operation on the error-corrected first program data and the second program data.

According to yet another aspect of the present disclosure, an electronic apparatus is provided. The apparatus may include one or more memories. The one or more memories may include a memory array with memory cells. The one or more memories may include a peripheral circuit. The peripheral circuit may be configured to perform a first program operation on the memory cells. The peripheral circuit may be configured to perform a read operation on the memory cells through a preset read voltage. The peripheral circuit may be configured to, when a fail bit count (FBC) read based on the preset read voltage meets a preset requirement perform a second program operation on the memory cells. The apparatus may include a memory controller coupled to the one or more memories and configured to control the one or more memories.

The technical solutions provided by the present disclosure may include the following advantageous effects. For instance, after the first program operation, the read operation is performed on the memory cells through the preset read voltage, so as to determine, according to the read result of the memory cells, whether the fail bit count of the memory cells meets the preset requirement after the first programming, and in the case where the preset requirement is met, the second programming is performed on the memory cells without the error correction with ECC, avoiding the impact of the complicated error correction with ECC process on the program efficiency, and improving the program efficiency on the basis of reducing the program error rate.

BRIEF DESCRIPTION OF THE DRAWINGS

The drawings to be used in description of examples of the present disclosure will be briefly introduced below in order to illustrate the technical solutions in the examples more clearly. Apparently, the drawings described below are merely some examples of the present disclosure. Those of ordinary skill in the art may obtain other drawings according to these drawings without creative work.

DETAILED DESCRIPTION

Examples of the present disclosure are further described below in detail in conjunction with the drawings.

A program method of a memory provided by the examples of the present disclosure may be applied to a memory. The memory may be a three-dimensional (3D) memory, e.g., such as a 3D NAND flash.

Figure 1:
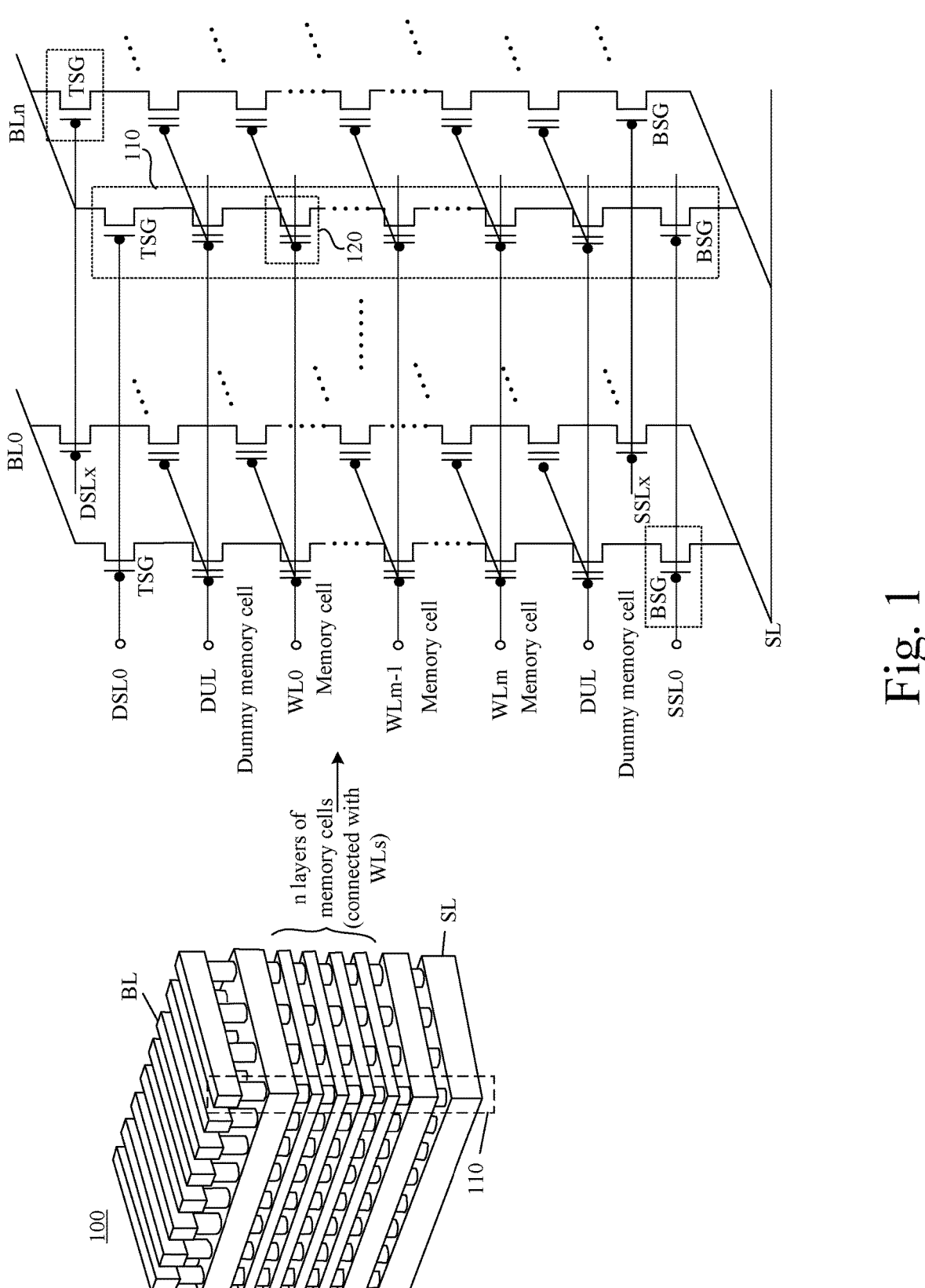
FIG. 1 is a schematic structural diagram of a 3D memory, according to one example of the present disclosure.

A 3D memory is a multi-layer stacked memory. Schematically, the 3D memory is a 3D NAND flash. As shown in FIG. 1, a plurality of memory strings 110 included in the 3D memory 100 are arranged along a direction parallel to a bearing surface of a substrate, and a plurality of memory cells 120 in each memory string 110 are arranged along a direction perpendicular to the bearing surface of the substrate. That is, the plurality of memory cells included in the 3D memory are arranged in a three-dimensional array on the substrate, and form a memory array.

The memory string 110 is connected with a Bit Line (BL) at one end, and connected with a Source Line (SL) at the other end.

The memory cells in each memory string are further connected with memory cells in other memory strings through a Word Line (WL). For example, each memory string may include 64 memory cells. Then, in this example, the 3D memory may include 64 word lines WL <63:0>, and each word line is connected with part of the memory cells on the same layer (e.g., having the same height relative to the substrate). It is to be noted that the 64 memory cells just represent an example, the present disclosure is not limited thereto, and in some examples, each memory string may include more than 64, e.g., 128, and 196, etc. memory cells. In the 3D memory, various memory cells connected with the same word line are referred to as a memory page, and all the memory strings sharing a set of word lines are referred to as a memory block.

The memory string 110 further includes an upper select transistor connected with a drain of a first memory cell, and a lower select transistor connected with a source of a last memory cell. The upper select transistor is also referred to as a Top Select Gate (TSG) or drain select transistor. The lower select transistor is also referred to as a Bottom Select Gate (BSG) or source select transistor.

A gate of the TSG is connected with a Drain Select Line (DSL), a source of the TSG is connected with the drain of the first memory cell, and a drain of the TSG is connected with the bit line.

A gate of BSG is connected with a Source Select Line (SSL), a drain of the BSG is connected with a source of the last memory cell, and a source of the BSG is connected with the source line.

As can be seen from FIG. 1, the memory cells in the memory string 110 and the memory cells in other memory strings share one set of WLs. Assuming that each memory string includes m+1 memory cells, the 3D memory may include m+1 WLs: WL0 to WLm, where m is an integer greater than 1. Each WL is connected with various memory cells on the same layer (e.g., having the same height relative to the bearing surface of the substrate). Alternatively, it may be understood that control gates of various memory cells on the same layer, and a gate connection line between various control gates constitute one WL.

Based on the amount of data that can be stored by the memory cells, the memory cells may be classified into a Single-Level Cell (SLC), a Multi-Level Cell (MLC), a Trinary-Level Cell (TLC), and a Quad-Level cell (QLC), etc. Each SLC can store 1 bit of data, each MLC can store 2 bits of data, each TLC can store 3 bits of data, and each QLC can store 4 bits of data. In the 3D memory, data stored in various memory cells on the same layer may constitute k memory pages, where k is the number of bits of data able to be stored by each memory cell.

In the examples of the present disclosure, the memory cells in the 3D memory each may be a field-effect transistor capable of storing data, such as a floating gate field-effect transistor or a charge trap field-effect transistor, etc. The TSG and the BSG may be an ordinary field-effect transistor, or the field-effect transistor capable of storing data. The floating gate field-effect transistor includes a source, a drain, and two gates. The two gates are both conductors, one of the two gates is a Control Gate (CG), and the other one is a Floating Gate (FG). The control gate is used to be connected with the word line, and the floating gate is used to store data. The charge trap field-effect transistor includes a source, a drain, a control gate, and a charge trap layer, where the charge trap layer is a cell for storing data and is made of an insulation material, such as silicon nitride. A data writing principle of the memory cell is introduced below by taking the floating gate field-effect transistor as an example.

During data writing to the memory cell, a program voltage may be loaded to control gate of the floating gate field-effect transistor to cause electrons in a channel of the floating gate field-effect transistor to tunnel to the floating gate. The number of the electrons tunneling to the floating gate can be controlled by controlling a magnitude of the program voltage, so as to control a magnitude of a threshold voltage Vth of the floating gate field-effect transistor. Typically, a higher quantity of charge stored in the floating gate indicates a higher threshold voltage Vth of the floating gate field-effect transistor. It may be understood that different threshold voltages Vth of the floating gate field-effect transistor correspond to different voltages required to be loaded to the control gate of the floating gate field-effect transistor to control the floating gate field-effect transistor to be on. Therefore, the magnitude of the threshold voltage Vth of the floating gate field-effect transistor may reflect content of data stored by the floating gate field-effect transistor.

It is to be understood that, in the 3D memory, channels of various memory cells in each memory string may be connected sequentially, and form a pillar-shaped structure perpendicular to the substrate.

During programming of the memory, for example, the MLC may be configured to store two digits of data represented by four Vth ranges (programmed states) per memory cell, the TLC may be configured to store three digits of data represented by eight Vth ranges (programmed states) per memory cell, the QLC may be configured to store four digits of data represented by sixteen Vth ranges (programmed states) per memory cell, and the like.

For example, when the 3D NAND flash is an MLC flash, the memory cells of the 3D NAND flash may be programmed into four states corresponding to bit codes 11, 10, 01, and 00, e.g., an erased state E0, and programmed states P1, P2, and P3. In another example, when the 3D NAND flash is a TLC 3D NAND flash, the memory cells of the 3D NAND flash may be programmed into eight programmed states corresponding to bit codes 111, 110, 010, 011, 001, 000, 100, and 101.

With the increase in demands for a storage capacity, current mainstream memory devices employ 3D NAND flashes. In order to pursue a higher storage density, the number of stack layers and the number of bits stored in a single memory cell are increasingly large. Schematically, currently there is a single memory cell storing four bits, and is referred to as a QLC. In order to achieve four-bit storage, one memory page is to be divided into 16 programmed states. In order to compress a threshold voltage distribution width of each programmed state on the memory page to increase a read window, a plurality of write operations are typically required to be performed on the memory page. In the examples of the present disclosure, illustration is performed by taking two write operations, which are a first program operation and a second program operation respectively, as an example, where the first program operation may also be referred to as Coarse Programming, and the second program operation may also be referred to as Fine Programming. The coarse programming and the fine programming are two phases of memory programming. An objective of the two phases is to ensure that data is written to the memory cell accurately while damage to the memory cell is avoided, thereby ensuring the reliability and lifetime of the memory.

A coarse programming phase aims at writing most of the data to the memory cells quickly, without very high precision. A high voltage and a large pulse width are used to quickly change the threshold voltage (Vth) of the memory cell (e.g., a floating gate transistor in the flash memory). Due to the use of a "coarse" method, a predefined value less than a target threshold voltage is typically set as a stop point to avoid Over-Programming.

A fine programming phase, which is performed after the coarse programming, aims at calibrating the memory cell after the coarse programming phase, so as to ensure the accuracy of the data and the performance of the memory. A low voltage and a small pulse width are used to adjust the threshold voltage of the memory cell more finely, so as to cause the threshold voltage to reach or be close to the target threshold voltage. The fine programming requires more time and finer control, but can improve the reliability of the memory and reduce data errors.

In the flash memory and some other non-volatile memory technologies, the two steps of the program process are closely related, where the coarse programming provides a foundation for the fine programming, and the fine programming ensures accurate storage of the data. Such two-step program process may balance a program speed and the data accuracy while extending the lifetime of the memory.

However, the coarse programming has a certain error probability per se, for example, when a power failure occurs, the coarse programming may cause the generation of error bits. Therefore, in the related technology, error correction with ECC is typically required to be performed on a program result of the coarse programming, and such error correction process necessarily increases an amount of data interaction between the memory and a memory controller and reduces the program efficiency.

Figure 2:
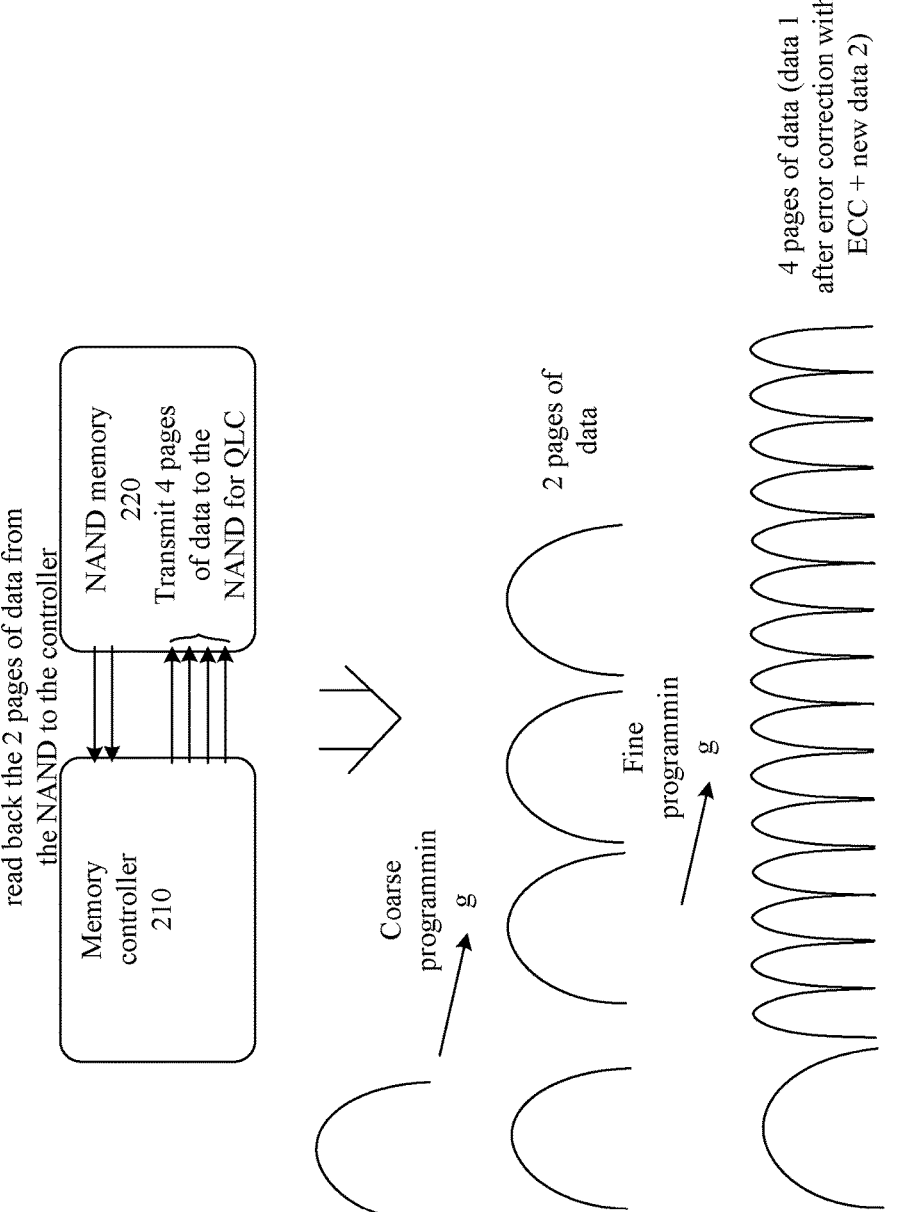
FIG. 2 is a schematic diagram of a data interaction between a memory and a memory controller, according to one example of the present disclosure.

As shown in FIG. 2, a memory controller 210 first sends 2 pages of data to a NAND memory 220 for coarse programming, and taking a 4-16 two-step program process as an example, the NAND memory 220 programs the 2 pages of data to obtain 4 programmed states, which include 1 erased state. After the coarse programming is completed, the NAND memory 220 feeds back a coarse program result of the 2 pages of data to the memory controller 210. That is, the memory controller 210 reads back the 2 pages of data from the NAND memory 220, and after the coarse program result is error-corrected with a memory Error Correction Code (ECC), sends the 2 pages of data after error correction with ECC and 2 pages of new data, e.g., a total of 4 pages of data, to the NAND memory 220 for fine programming. The NAND memory 220 performs the fine programming on the 4 pages of data to obtain 16 programmed states, which include 1 erased state.

If no error correction with ECC is performed on the program result of the coarse programming, a situation where the programming error bits of the coarse programming cause a program result error during the fine programming phase may occur.

Figure 3:
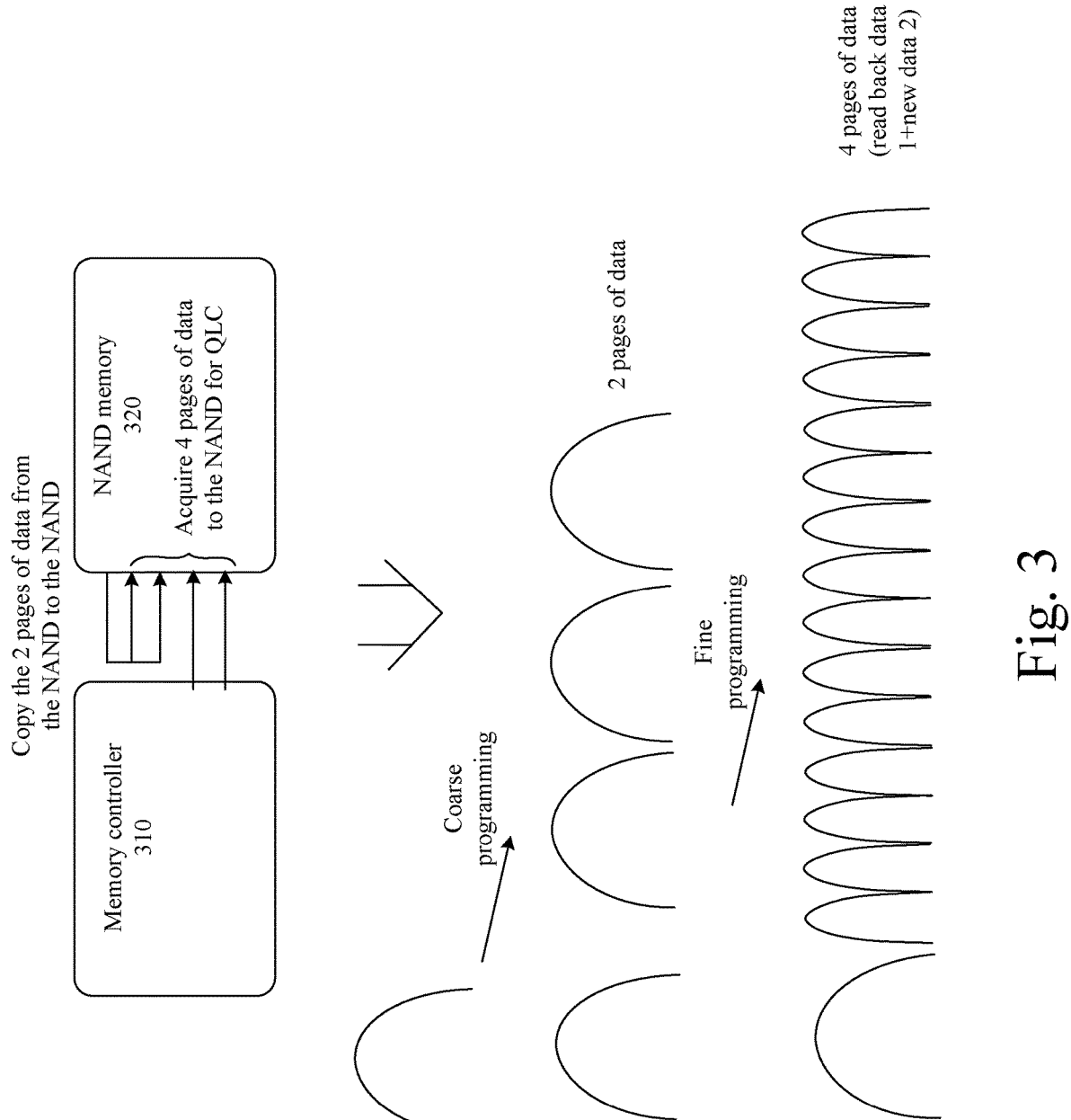
FIG. 3 is a schematic diagram of a data interaction between a memory and a memory controller, according to one example of the present disclosure.

As shown in FIG. 3, a memory controller 310 first sends 2 pages of data to a NAND memory 320 for coarse programming, and taking a 4-16 two-step program process as an example, the NAND memory 320 programs the 2 pages of data to obtain 4 programmed states, which include 1 erased state. After the coarse programming is completed, the NAND memory 320 copies and reads back the coarse program result of the 2 pages of data into the NAND memory 320, and receives 2 pages of data sent by the memory controller 310, e.g., a total of 4 pages of data. The NAND memory 320 performs fine programming on the 4 pages of data to obtain 16 programmed states, which include 1 erased state. However, if there is error data in 4 programmed states obtained during the coarse programming, an increase of error data in 16 programmed states obtained by final programming may be caused, thereby decreasing the program accuracy.

Figure 4:
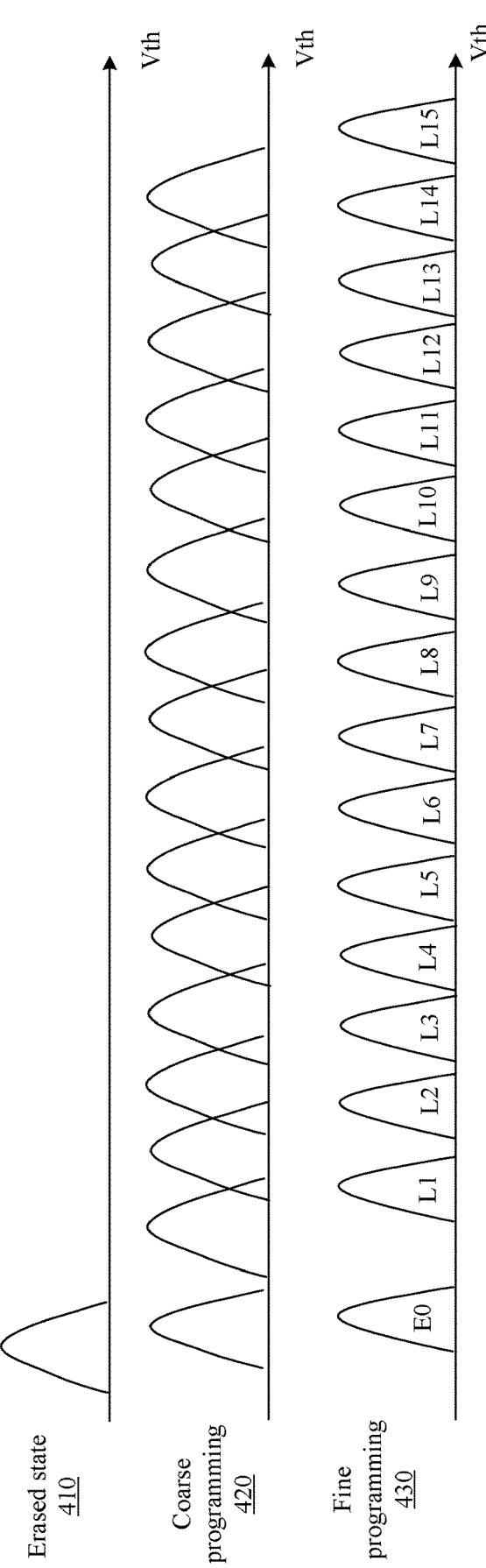
FIG. 4 is a schematic process diagram of 16-16 two-step program, according to one example of the present disclosure.

In a write process, the memory page first may be coarsely programmed into 16 programmed states, and then the 16 programmed states are finely programmed into the final 16 programmed states. Schematically, as shown in FIG. 4, in a 16-16 two-step program process, an erased state 410 exists, and then coarse programming 420 is performed on the memory page to obtain 16 programmed states having a wide threshold voltage distribution width. Then, fine programming 430 is performed on the memory page based on the coarse programming to compress the threshold voltage distribution width of each programmed state.

However, in order to save program time, typically, n programmed states (n<16) are obtained during the coarse programming, rather than 16 programmed states. For example, 8 programmed states may be obtained first by the coarse programming, and then the 8 programmed states are finely programmed into 16 programmed states.

Figure 5:
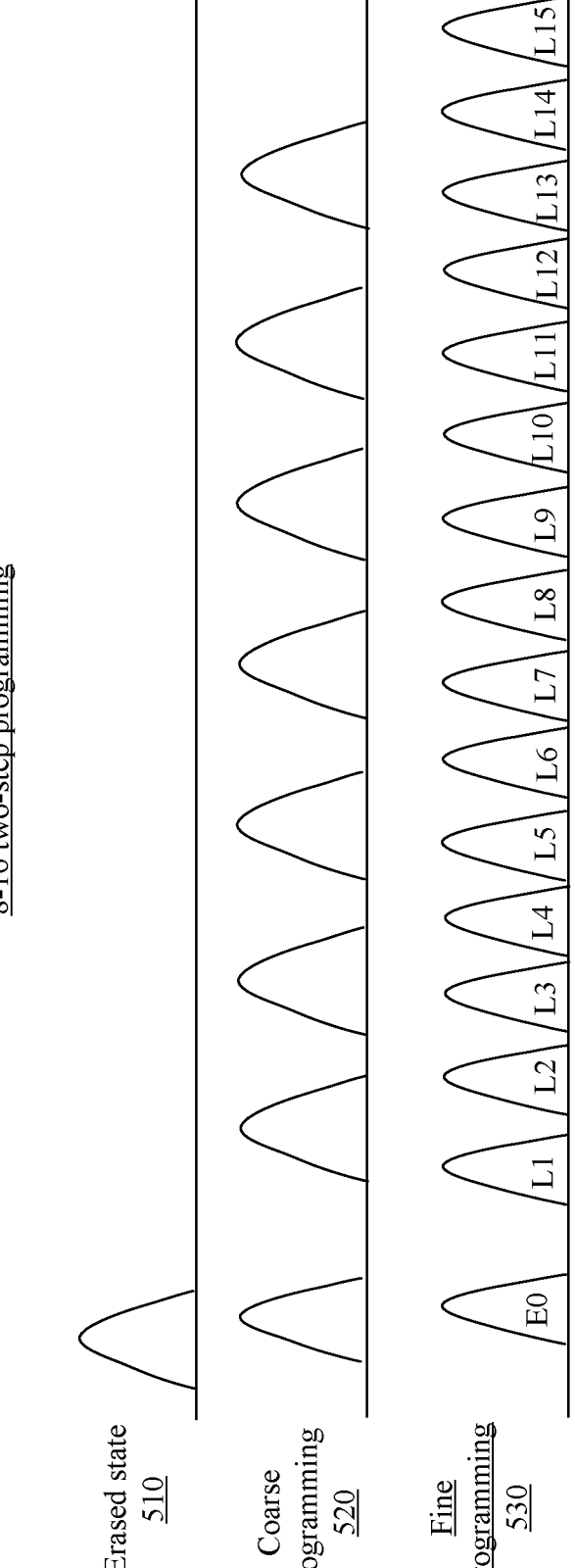
FIG. 5 is a schematic process diagram of 8-16 two-step program, according to one example of the present disclosure.

As shown in FIG. 5, in an 8-16 two-step program process, an erased state 510 exists, and then coarse programming 520 is performed on the memory page to obtain 8 programmed states having a wide threshold voltage distribution width. Then, fine programming 530 is performed on the memory page based on the coarse programming to compress the threshold voltage distribution width of each programmed state on the memory page and obtain 16 programmed states on the memory page.

Additionally and/or alternatively, 4 programmed states may be obtained first by the coarse programming, and then the 4 programmed states are finely programmed into 16 programmed states.

Figure 6:
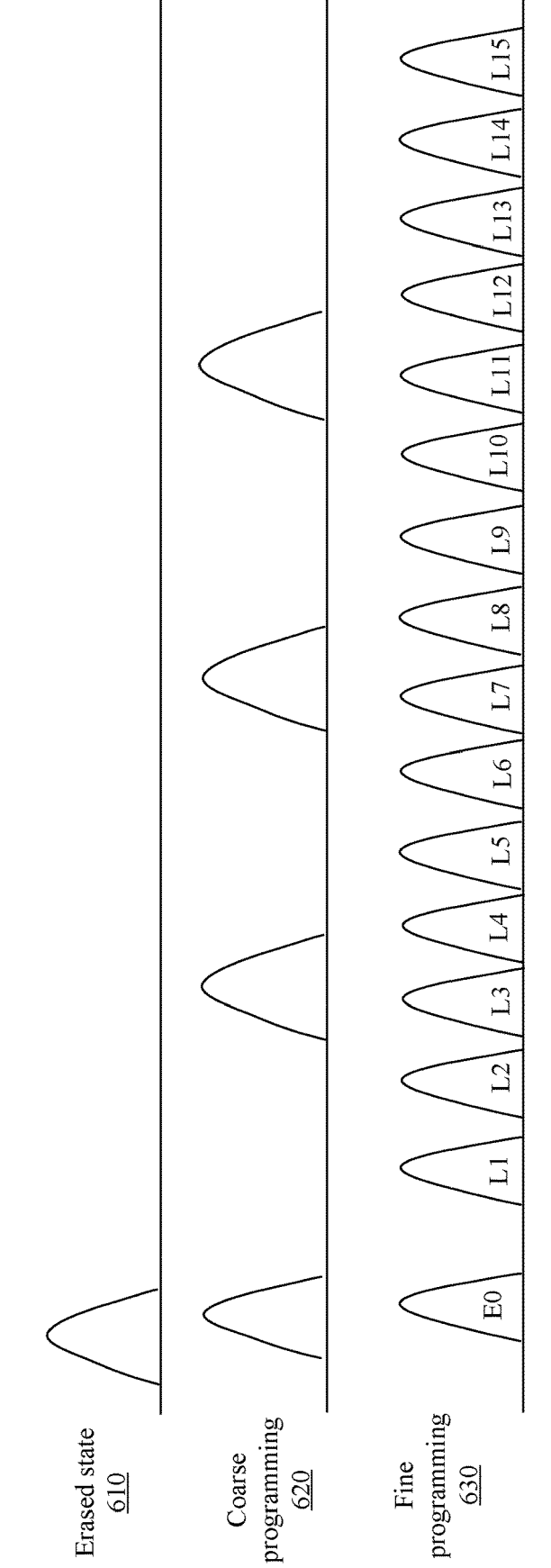
FIG. 6 is a schematic process diagram of 4-16 two-step program, according to one example of the present disclosure.

As shown in FIG. 6, in a 4-16 two-step program process, an erased state 610 exists, and coarse programming 620 is performed on the memory page to obtain 4 programmed states having a wide threshold voltage distribution width. Then, fine programming 630 is performed on the memory page based on the coarse programming to compress the threshold voltage distribution width of each programmed state on the memory page and obtain 16 programmed states on the memory page.

It is worth noting that the above two-step program solution is provided by way of example and not limitation, and the two-step programming may be also implemented as other solutions such as 8-32 two-step programming, 16-32 two-step programming, etc.

In the examples of the present disclosure, a solution is provided, in which the number of coarse programming error bits is estimated first based on read voltages and then whether to perform the error correction with ECC is determined according to error bit data.

Figure 7:
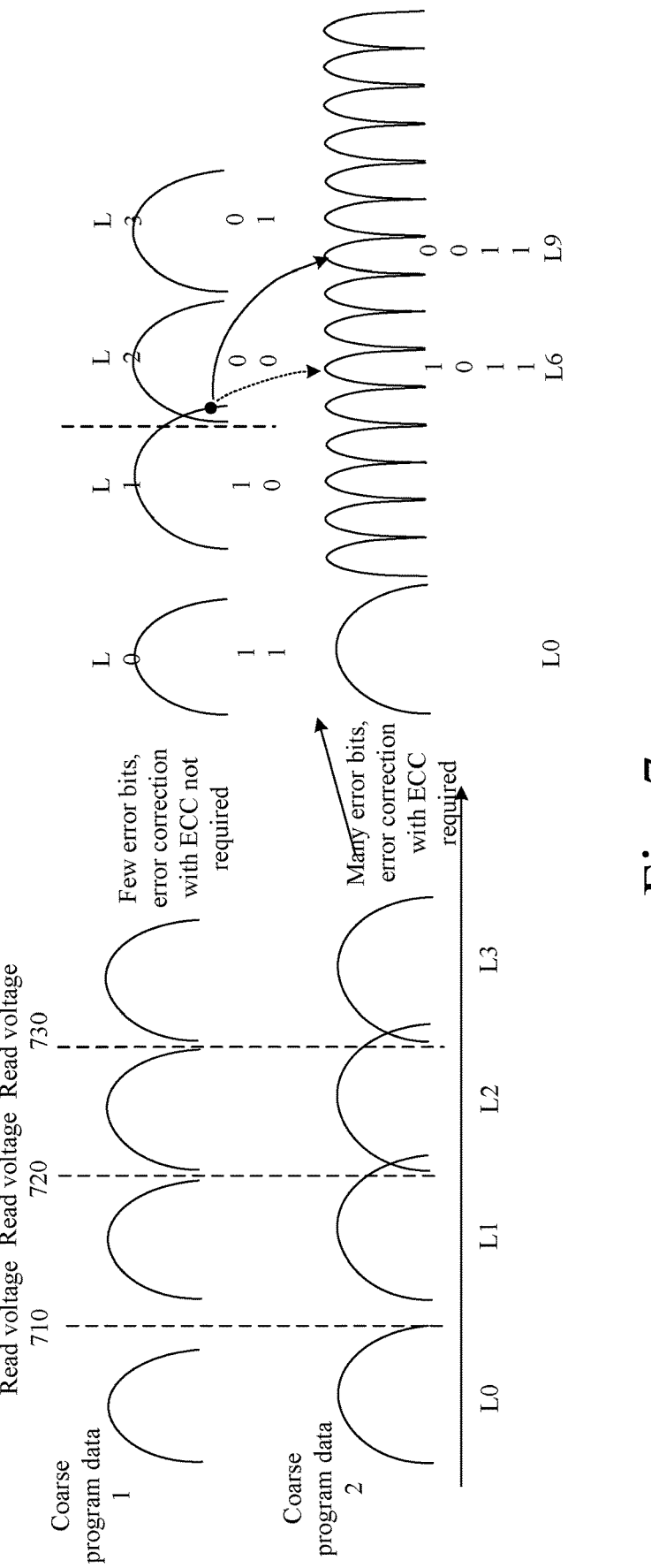
FIG. 7 is a schematic diagram of coarse programming error bits, according to one example of the present disclosure.

As shown in FIG. 7, after first programming, for coarse program data 1, 4 programmed states are obtained after the coarse programming, where after reading with a read voltage 710, a read voltage 720, and a read voltage 730, the error correction with ECC is not required upon determining that there are few error bits. For coarse program data 2, 4 programmed states are obtained after the coarse programming, where after the reading with the read voltage 710, the read voltage 720, and the read voltage 730, the error correction with ECC may be implemented upon determining that the number of error bits meets a threshold number; for example, a programmed state 1 and a programmed state 2 have a significant overlap therebetween; if no error correction with ECC is performed, after second programming, the programmed state 1 obtained by the coarse programming, which corresponds to a programmed state 6 obtained by the fine programming, is incorrectly programmed into a programmed state 9, thereby generating a program result error.

Figure 8:
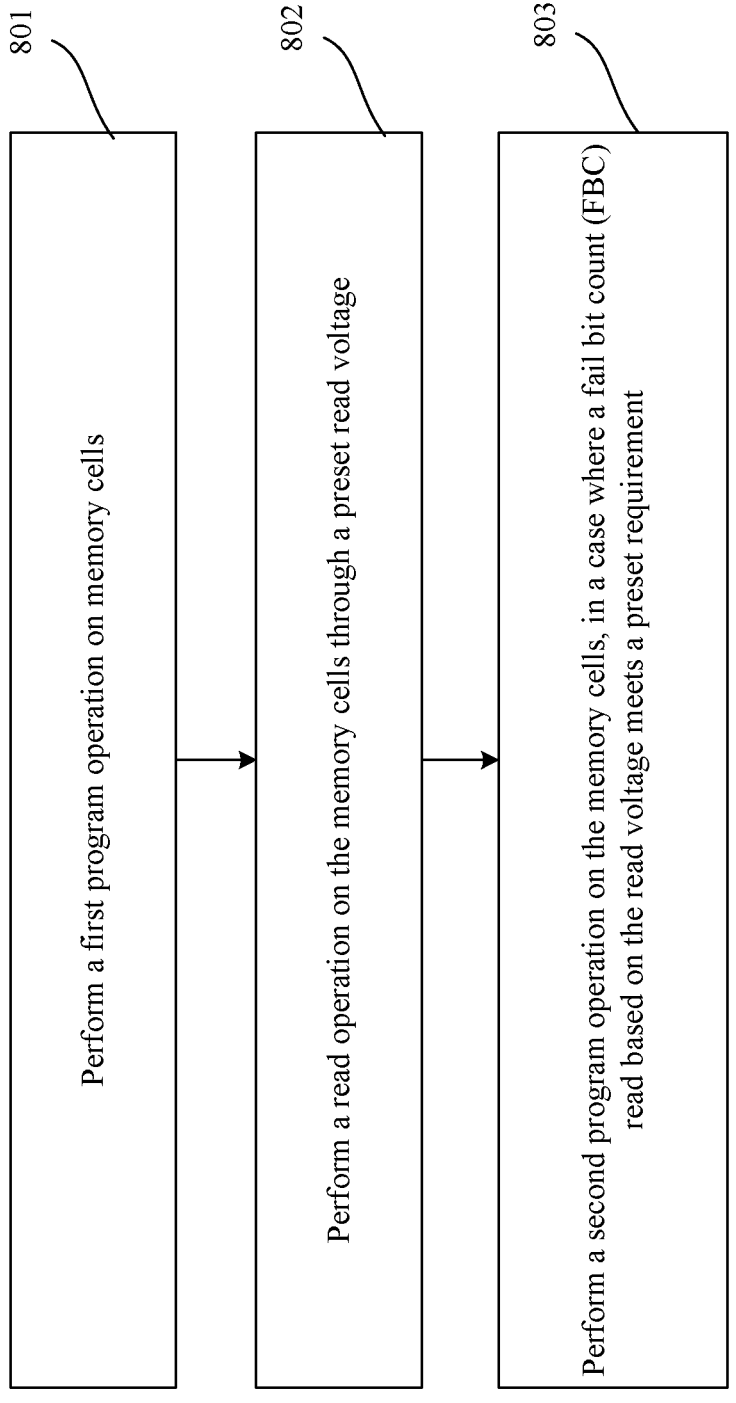
FIG. 8 is a flow diagram of a program method of a memory, according to one example of the present disclosure.

In the examples of the present disclosure, the following method of programming a memory is provided in response to the above situations. In some examples, the method is executed by a peripheral circuit in the memory (e.g., a NAND memory). The memory includes a memory array and the peripheral circuit, and the memory array includes memory cells, where the memory cells coupled with a first word line form one memory page. FIG. 8 illustrates a flow diagram of a program method of a memory provided by one example implementation of the present disclosure. The method includes the following operations.

Referring to FIG. 8, at operation 801, the method may include performing a first program operation on memory cells.

In an example, n programmed states are obtained after the first program operation on the memory cells, n being a positive integer.

Taking the two-step programming as an example, the first program operation is the first step of programming of the two-step programming. In some implementations, the first program operation may also be referred to as coarse programming.

In some examples, based on a two-step programming mode, the first program operation is performed on the memory cells to obtain the n programmed states. Taking the two-step programming implemented as 4-16 two-step programming as an example, after the first program operation on the memory cells, 4 programmed states are obtained, which include 1 erased state.

At operation 802, the method may include performing a read operation on the memory cells through a preset read voltage.

After the first program operation on the memory cells, the read operation is performed on the memory cells through a plurality of preset read voltages, where the preset read voltages are used to determine the program accuracy of the n programmed states obtained by the first programming.

In an example, performing the read operation on the memory cells through the plurality of preset read voltages include at least one of the following reading techniques: 1) reading the number of memory cells between two adjacent read voltages of the plurality of preset read voltages; or 2) using the plurality of preset read voltages as a default read level, reading the number of memory cells within a preset offset range of the default read level.

A case of a program error after the first program operation on the memory cells is determined by performing the read operation on the memory cells through the plurality of preset read voltages, thereby determining whether the error correction with ECC is to be performed on the program result of the first program operation.

In some examples, the preset read voltage is determined based on the two-step programming mode. That is, the preset read voltage is determined according to the number of programmed states implemented by the first program operation in the two-step programming mode, where the preset read voltage corresponds to a voltage value between threshold voltages implemented by two adjacent programmed states, and the preset read voltage is a voltage preset based on the two-step programming mode.

In some examples, first program data is received from a memory interface, and the first program operation is performed on the memory cells according to the first program data to obtain the n programmed states.

At operation 803, the method may include performing a second program operation on the memory cells in a case where a fail bit count read based on the read voltage meets a preset requirement.

In some examples, the second program operation is performed on the memory cells to obtain m programmed states, n≤m.

The Fail Bit Count (FBC) read based on the read voltage meeting the preset requirement means that a read result of the read voltage indicates that the number of memory cells in a read window meets the preset requirement after the first program operation.

In some examples, the read window meeting the preset requirement refers to a requirement for the number of memory cells in the read window. The read result of the read voltage is used to indicate whether the n programmed states obtained by the first program operation require the error correction with ECC.

In an example, when the read result of the read voltage indicates that the read window of the memory cells meets the preset requirement after the first programming, it indicates that the memory cells does not require the error correction with ECC after the first programming, so that the error correction process is omitted and the second programming is performed on the memory cells to obtain the m programmed states.

In some examples, in a case where the read result of the read voltage indicates that the first program operation on the memory cells meets the preset requirement, second program data is received from the memory interface, and the second program operation is performed on the memory cells according to the first program data and the second program data to obtain the m programmed states.

In some examples, when the read result of the read voltage indicates that the memory cells in the read window require the error correction with ECC after the first program operation, the error correction with ECC is performed on a first program result, error-corrected data is received from the memory interface, and the second program operation is performed on the memory cells according to the error-corrected data to obtain the m programmed states.

That is, reading is performed on the memory cells through a plurality of preset read voltages, and whether the first program operation on the memory cells meets the preset requirement is determined based on the number of memory cells that is read through the plurality of preset read voltages.

The error correction with ECC is an error correction code technology used to detect and correct errors during storage or transmission of data, which implements error detection and correction by adding redundant bits into the data. During error correction using the ECC, the data is divided into blocks of fixed sizes, and each block has one or more redundant bits that are generated by an ECC algorithm according to bits in the data block and are stored or transmitted together with the data. At a data receiving end, the ECC algorithm recalculates redundant bits and makes a comparison with received data; and if an error is found, the ECC algorithm may determine an error data bit and correct the error data bit. Through the use of the redundant bits and the error correction algorithm, the ECC can detect and correct a single or a plurality of error bits, improving the reliability and integrity of the data.

In an example, in a case where the read result corresponding to the read voltage indicates that error correction processing is to be performed on the memory cells, the error correction with ECC is performed on the memory cells, and after the error correction with ECC, the second programming is performed on the memory cells to obtain the m programmed states. In the case where the read result of the read voltage indicates that the error correction is to be performed on the memory cells, the program result of the first program data is sent to the memory controller for the error correction with ECC; the first program data after the error correction with the ECC performed by the memory controller and the second program data are received from the memory interface, and the second program operation is performed on the memory cells according to the first program data after the error correction with the ECC and the second program data to obtain the m programmed states.

In some examples, in the case where the fail bit count read based on the read voltage does not meet the preset requirement, the first program data after the error correction with the ECC is received from the memory interface, the second program data is received from the memory interface, and the second program operation is performed on the memory cells according to the first program data after the error correction with the ECC and the second program data.

That is, in the program method of the memory provided by the examples of the present disclosure, after the first program operation, the read operation is performed on the memory cells through the preset read voltage, so as to determine, according to the read result of the memory cells, whether the fail bit count of the memory cells meets the preset requirement after the first programming, and in the case where the preset requirement is met; the second programming is performed on the memory cells without the error correction with ECC, avoiding the impact of the complicated error correction with ECC process on the program efficiency, and improving the program efficiency on the basis of reducing the program error rate.

Figure 9:
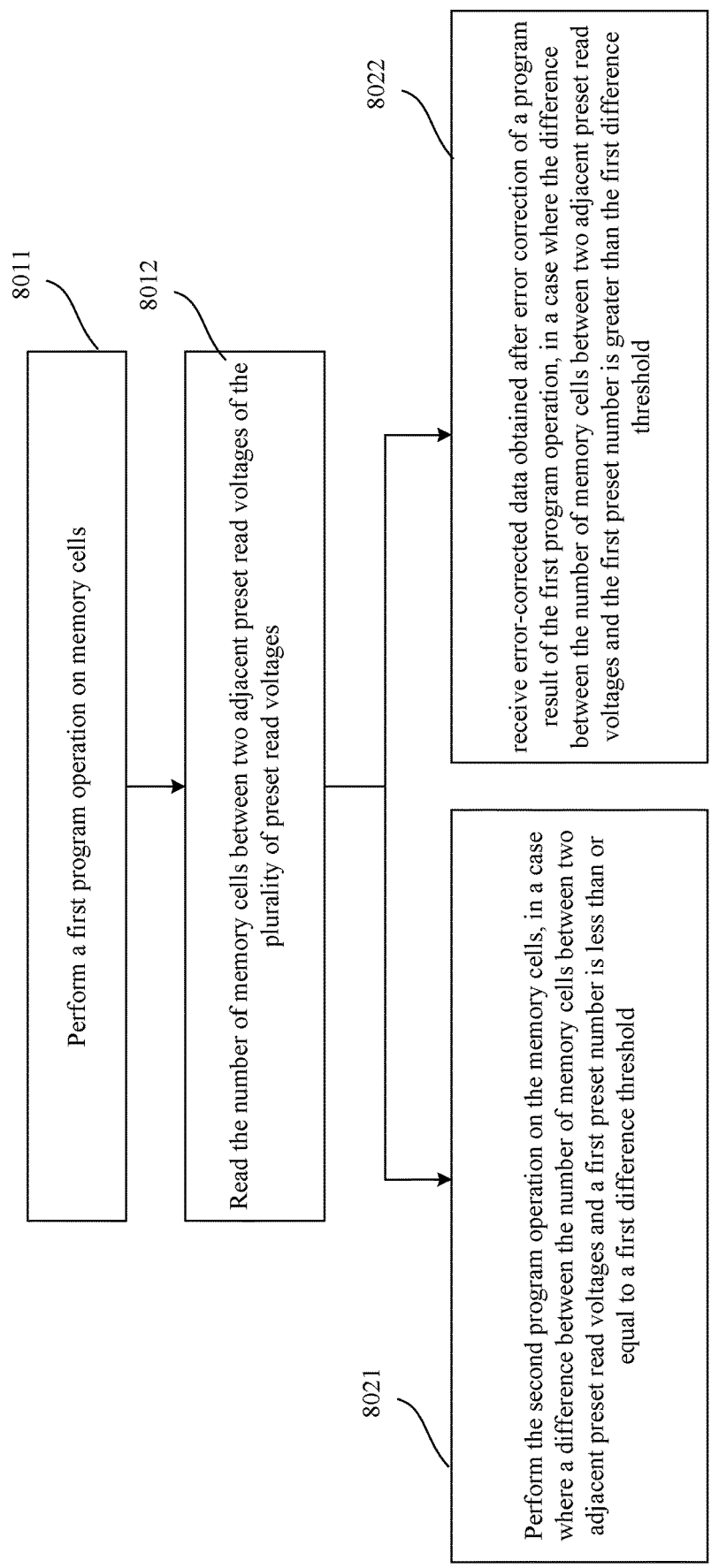
FIG. 9 is a flow diagram of a program method of a memory, according to one example of the present disclosure.

In an example, the number of memory cells between two adjacent read voltages is read through a plurality of preset read voltages, and the fail bit count is determined according to the read number of the memory cells, thereby determining whether the first programming meets the preset requirement. FIG. 9 is a flow diagram of a program method of a memory provided by another example implementation of the present disclosure. As shown in FIG. 9, the process includes operations 8011, 8012, 8021, and 8022.

Referring to FIG. 9, at operation 8011, the method may include performing a first program operation on memory cells.

In an example, n programmed states are obtained after the first program operation on the memory cells, n being a positive integer.

At operation 8012, the method may include reading the number of memory cells between two adjacent preset read voltages of the plurality of preset read voltages.

Typically, after the first program operation is performed on the memory cells to obtain the n programmed states, one page of data is distributed in the various programmed states uniformly, and in designing the plurality of preset read voltages, a preset read voltages is designed to be an intermediate voltage between the threshold voltages corresponding to the adjacent storage states, so that the read number of memory cells between two adjacent preset read voltages is close to one another, and the number of memory cells between two adjacent preset read voltages is also close to the number of memory cells corresponding to each programmed state after uniform allocation. Therefore, the program result of the first program operation is determined based on the number of memory cells between the two adjacent preset read voltages.

In some examples, the plurality of preset read voltages are applied to bit lines coupled with the memory cells, and a threshold voltage reached by each memory cell is read, thereby determining the number of memory cells between two adjacent read voltages.

In some examples, the number of the preset read voltages is greater than 3; that is, there are at least two sets of two adjacent preset read voltages with the number of memory cells therebetween to be read.

Figure 10:
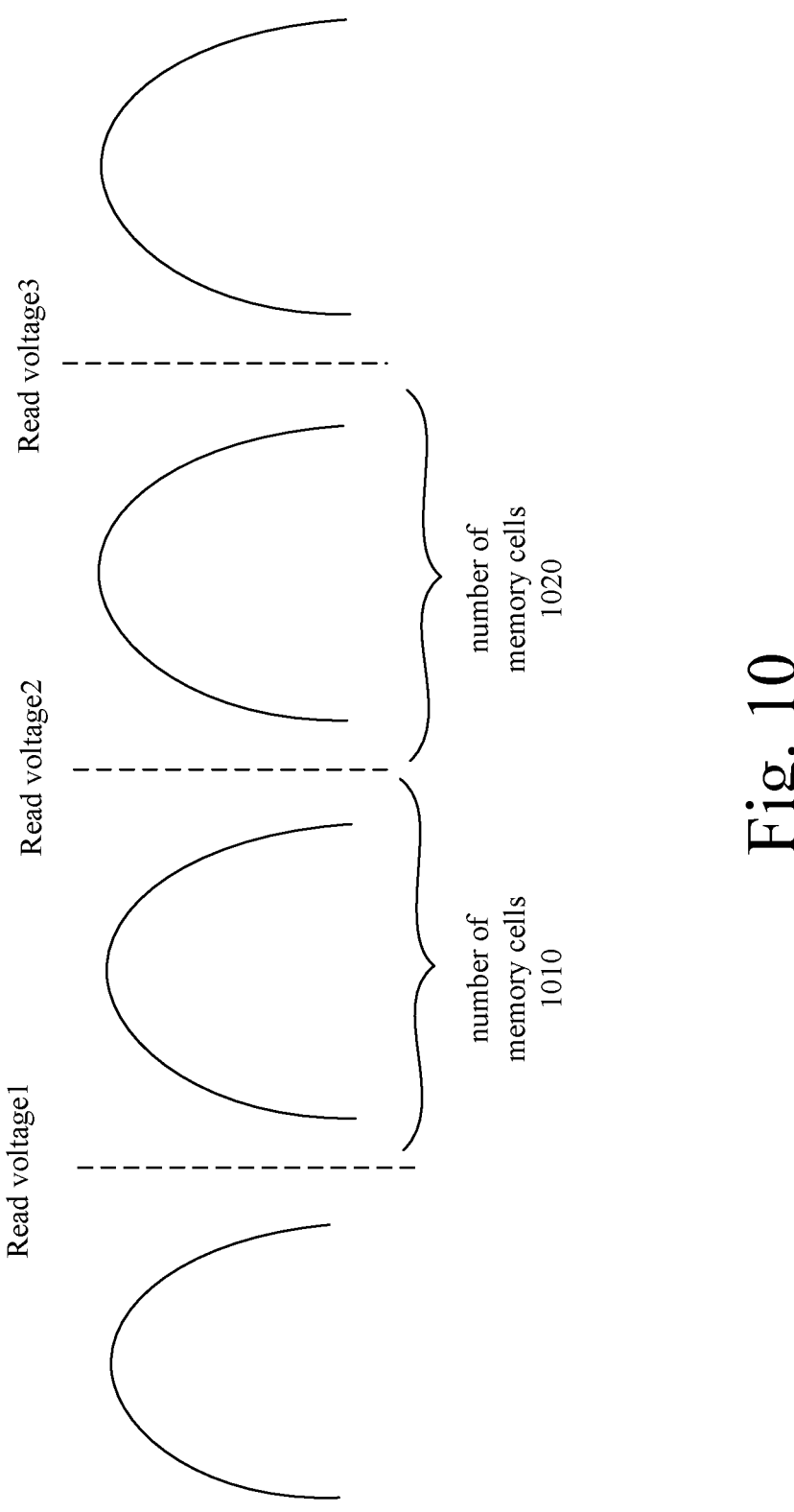
FIG. 10 is a schematic diagram of a verify solution provided based on the example shown in FIG. 9.

Referring to FIG. 10, 4 programmed states are obtained after the first programming on the memory cells, the read operation is performed on the memory cells through the preset read voltage 1, read voltage 2, and read voltage 3, a number 1010 of memory cells between the read voltage 1 and the read voltage 2 is determined, and a number 1020 of memory cells between the read voltage 2 and the read voltage 3 is determined.

In an example, determining the number of memory cells between two adjacent read voltages means determining first memory cells reaching a threshold voltage between the two adjacent read voltages after the first programming and determining the number of the first memory cells.

In some examples, the fail bit count is determined based on the number of memory cells between the two adjacent preset read voltages, thereby determining, based on the fail bit count, whether the first program operation on the memory cells meets the preset requirement.

In some examples, one page of data is distributed in the various programmed states uniformly after the first program operation. Taking 4-16 two-step programming as an example for illustration, one page of 16 KB data is distributed in 4 programmed states uniformly after the first program operation, where each programmed state corresponds to 4 KB data. That is, if the first program operation on the memory cells meets the preset requirement, the number of memory cells corresponding to each programmed state corresponds to 4 KB data. That is, whether the fail bit count meets the preset requirement is determined based on a difference between the number of memory cells between two adjacent preset read voltages and 4 KB.

In some examples, a first preset number is set based on a data amount of the one page of data, and the first preset number is used to represent a data amount corresponding to each programmed state after the data amount of the one page of data is distributed uniformly in the n programmed states.

At operation 8021, the method may include performing the second program operation on the memory cells in a case where a difference between the number of memory cells between two adjacent preset read voltages and a first preset number is less than or equal to a first difference threshold.

The first difference threshold is a preset value used for constraining an error rate of the first programming. When the difference between the number of memory cells between two adjacent preset read voltages and the first preset number is less than or equal to the first difference threshold, this indicates that the fail bit count represented by the memory cells between two adjacent preset read voltages is small after the first program operation. This means that the first program operation on the memory cells meets the preset requirement.

Meeting the preset requirement means that the first program result obtained after the first program operation on the memory cells has less than a threshold number of errors, in which case the second program operation may be performed.

As shown in FIG. 10, taking the one page of 16 KB data that yields 4 programmed states after the first program operation as an example, after the first program operation on the memory cells, the read operation is performed on the memory cells through the preset read voltage 1, read voltage 2, and read voltage 3, the number 1010 of memory cells between the read voltage 1 and the read voltage 2 is determined, and the number 1020 of memory cells between the read voltage 2 and the read voltage 3 is determined. After the 4 programmed states are obtained, the number of memory cells corresponding to each programmed state corresponds to 4 KB, so a first difference between the number 1010 of memory cells and 4 KB is determined, and a second difference between the number 1020 of memory cells and 4 KB is determined. The first difference between the number 1010 of memory cells and 4 KB represents a difference between the number of memory cells between the read voltage 1 and the read voltage 2 corresponding to the programmed state obtained by programming and an ideal number of memory cells. Similarly, the second difference between the number 1020 of memory cells and 4 KB represents a difference between the number of memory cells between the read voltage 2 and the read voltage 3 corresponding to the programmed state obtained by programming and an ideal number of memory cells.

In determining whether the first program operation on the memory cells meets the preset requirement, the first difference threshold is acquired, respective relationships of the first difference and the second difference with respect to the first difference threshold are determined, and if the first difference is less than or equal to the first difference threshold, and the second difference is less than or equal to the first difference threshold, then it is determined that the first program operation on the memory cells meets the preset requirement.

At operation 8022, when the difference between the number of memory cells between two adjacent preset read voltages and the first preset number is greater than the first difference threshold, the method may include receiving error-corrected data obtained after error correction of a program result of the first program operation.

When the difference between the number of memory cells between two adjacent preset read voltages and the first preset number is greater than the first difference threshold, this indicates that the fail bit count between the two adjacent preset read voltages is large after the first program operation. This means that the first program operation for memory cells requires the error correction processing, in which case the error-corrected data obtained after the error correction of the program result of the first program operation is received from the memory interface. The difference between the number of memory cells and the first preset number may be greater than the first difference threshold in one or more of the following situations: 1) due to an error in the threshold voltage of the programmed state during the first program operation on the memory cells, the threshold voltages of two adjacent programmed states have an overlap therebetween, or 2) a threshold voltage range of the programmed state increases, so that the read number of memory cells between two adjacent read voltages includes not only the number of memory cells corresponding to the programmed state between the two adjacent read voltages but also the number of memory cells corresponding to the adjacent programmed states. In this case the read number of memory cells between two adjacent read voltages is greater than the first preset number; or since the threshold voltage range of the programmed state becomes larger, the read number of memory cells between two adjacent read voltages includes the number of part of the memory cells corresponding to the programmed state, in which case the read number of memory cells between two adjacent read voltages is less than the first preset number.

Taking the one page of 16 KB data that yields 4 programmed states after the first program operation as an example, after the first program operation on the memory cells, the read operation is performed on the memory cells through the preset read voltage 1, read voltage 2, and read voltage 3, the number of memory cells between the read voltage 1 and the read voltage 2 is determined, and the number of memory cells between the read voltage 2 and the read voltage 3 is determined. After the 4 programmed states are obtained, the number of memory cells corresponding to each programmed state corresponds to 4 KB, so the first difference between the number of memory cells between the read voltage 1 and the read voltage 2 and 4 KB is determined, and the second difference between the number of memory cells between the read voltage 2 and the read voltage 3 and 4 KB is determined. The first difference between the number of memory cells between the read voltage 1 and the read voltage 2 and 4 KB represents a difference between the number of memory cells between the read voltage 1 and the read voltage 2 corresponding to the programmed state obtained by programming and an ideal number of memory cells. Similarly, the second difference between the number of memory cells between the read voltage 2 and the read voltage 3 and 4 KB represents a difference between the number of memory cells between the read voltage 2 and the read voltage 3 corresponding to the programmed state obtained by programming and an ideal number of memory cells.

In determining whether the first program operation on the memory cells meets the preset requirement, the first difference threshold is acquired, the relationships of the first difference and the second difference with respect to the first difference threshold are determined, and if the first difference is greater than the first difference threshold, or the second difference is greater than the first difference threshold, then error correction processing is implemented for the first program operation on the memory cells. Here, the error-corrected data obtained after the error correction of the program result of the first program operation is received from the memory interface.

That is, in the method of programming the memory provided by the examples of the present disclosure, after the first programming, the read operation is performed on the memory cells through the preset read voltage, so as to determine, according to the read result of the memory cells, whether the read window of the memory cells meets the preset requirement after the first programming. In the case where the preset requirement is met, the second programming is performed on the memory cells without the error correction with ECC, thereby avoiding the impact of the complicated err or correction with ECC process on the program efficiency, and improving the program efficiency on the basis of reducing the program error rate.

In the method provided by the examples, by reading the number of memory cells between two adjacent ones in the plurality of preset read voltages, whether the first program operation on the memory cells meets the preset requirement is determined according to a comparison relationship of the difference between the number of memory cells and the first preset number with respect to the first difference threshold, thereby improving the efficiency of checking the first program operation on the memory cells and improving the program efficiency.

Figure 11:
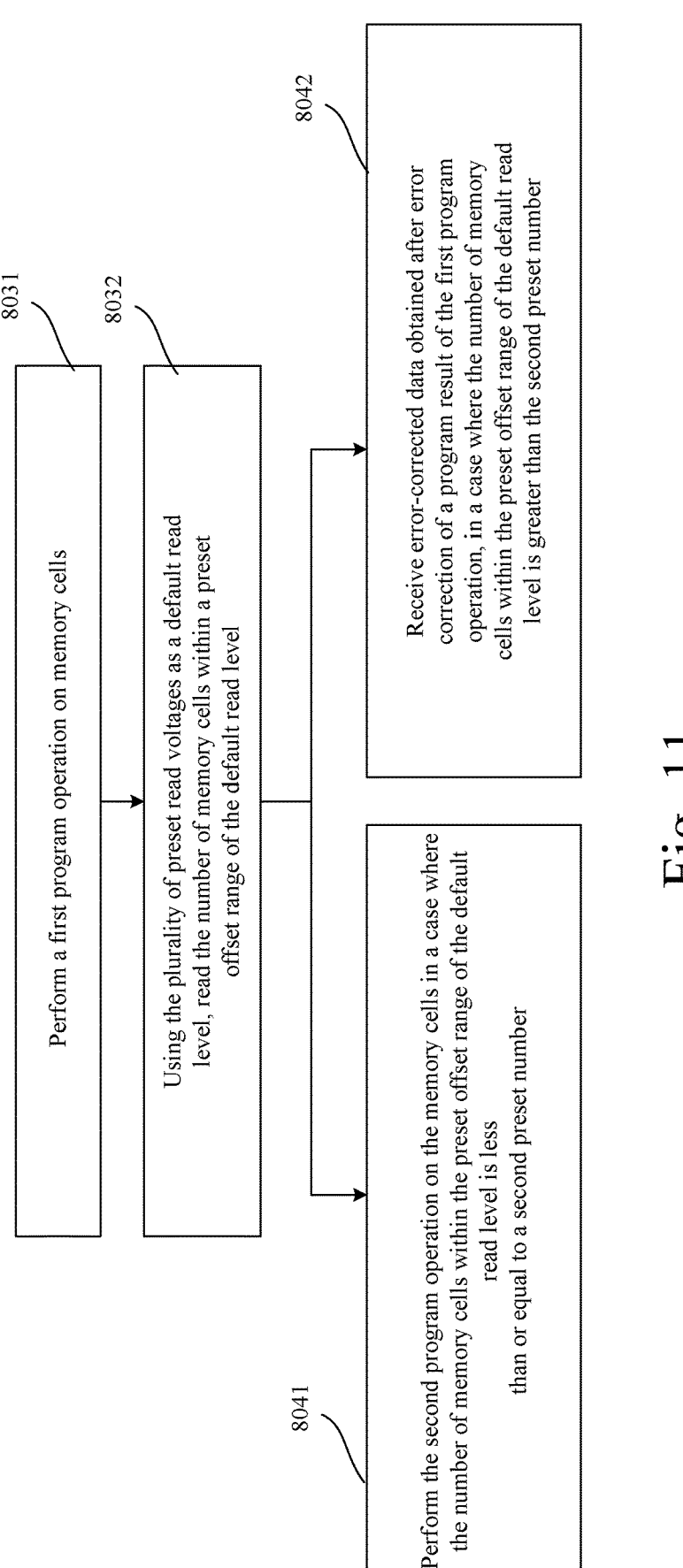
FIG. 11 is a flow diagram of a program method of a memory, according to one example of the present disclosure.

In one example, using the plurality of preset read voltages as a default read level, the number of memory cells within the preset offset range of the default read level is read, and the fail bit count is determined according to the read number of memory cells, thereby determining whether the first program operation meets the preset requirement. FIG. 11 is a flow diagram of a program method of a memory provided by still another example implementation of the present disclosure. As shown in FIG. 11, the method includes the following operations 8031, 8032, 8041, and 8042.

Referring to FIG. 11, at operation 8031, the method may include performing a first program operation on memory cells.

In an example, n programmed states are obtained after the first program operation on the memory cells, n being a positive integer.

At operation 8032, the method may include, using the plurality of preset read voltages as a default read level, reading the number of memory cells within a preset offset range of the default read level.

Typically, after the first programming is performed on the memory cells to obtain the n programmed states, one page of data is distributed in the various programmed states uniformly, with a voltage interval being present between the threshold voltages corresponding to the various programmed states, and in designing the plurality of preset read voltages, a preset read voltage is designed to be an intermediate voltage between the threshold voltages corresponding to the adjacent storage states. That is, the preset read voltage is designed in a voltage interval between the threshold voltages corresponding to two adjacent programmed states.

The preset offset range is a preset offset range determined according to a predesigned offset voltage, where ways to determine the preset offset range include at least one of following ways:

1) adding the offset voltage to the preset read voltage to obtain an offset node voltage, and determining a range between the preset read voltage and the offset node voltage as the preset offset range;

2) subtracting the offset voltage from the preset read voltage to obtain an offset node voltage, and determining a range between the preset read voltage and the offset node voltage as the preset offset range;

3) adding the offset voltage to the preset read voltage to obtain a first offset node voltage, subtracting the offset voltage from the preset read voltage to obtain a second offset node voltage, and determining a range between the first offset node voltage and the second offset node voltage as the preset offset range; or 4) adding a first offset voltage to the preset read voltage to obtain a first offset node voltage, subtracting a second offset voltage from the preset read voltage to obtain a second offset node voltage, and determining a range between the first offset node voltage and the second offset node voltage as the preset offset range.

A value of the offset voltage is determined based on the voltage interval between the threshold voltages corresponding to the various programmed states after the first program operation. In some examples, the value of the offset is equal to half of the voltage interval, for example, if a threshold voltage of a first programmed state is 0-1 V, and a threshold voltage of a second programmed state is 2-3 V, then a voltage interval between the first programmed state and the second programmed state is 1-2 V, e.g., a 1 V voltage interval. As such, the preset read voltage is 1.5 V, the offset is 0.5 V, and the preset offset range is 1-2 V.

It is worth noting that the above ways to determine the preset offset range are merely schematic examples, and the examples of the present disclosure do not limit the ways to determine the preset offset range.

In some examples, the number of the preset read voltages is greater than 1, and corresponding preset offset ranges are determined based on each preset read voltage, respectively.

A preset offset range is determined based on the voltage interval between the threshold voltages corresponding to two adjacent programmed states, and by determining the number of memory cells within the preset offset range, the number of memory cells that go beyond the threshold voltage corresponding to the programmed state after the first program operation on the memory cells is determined.

Figure 12:
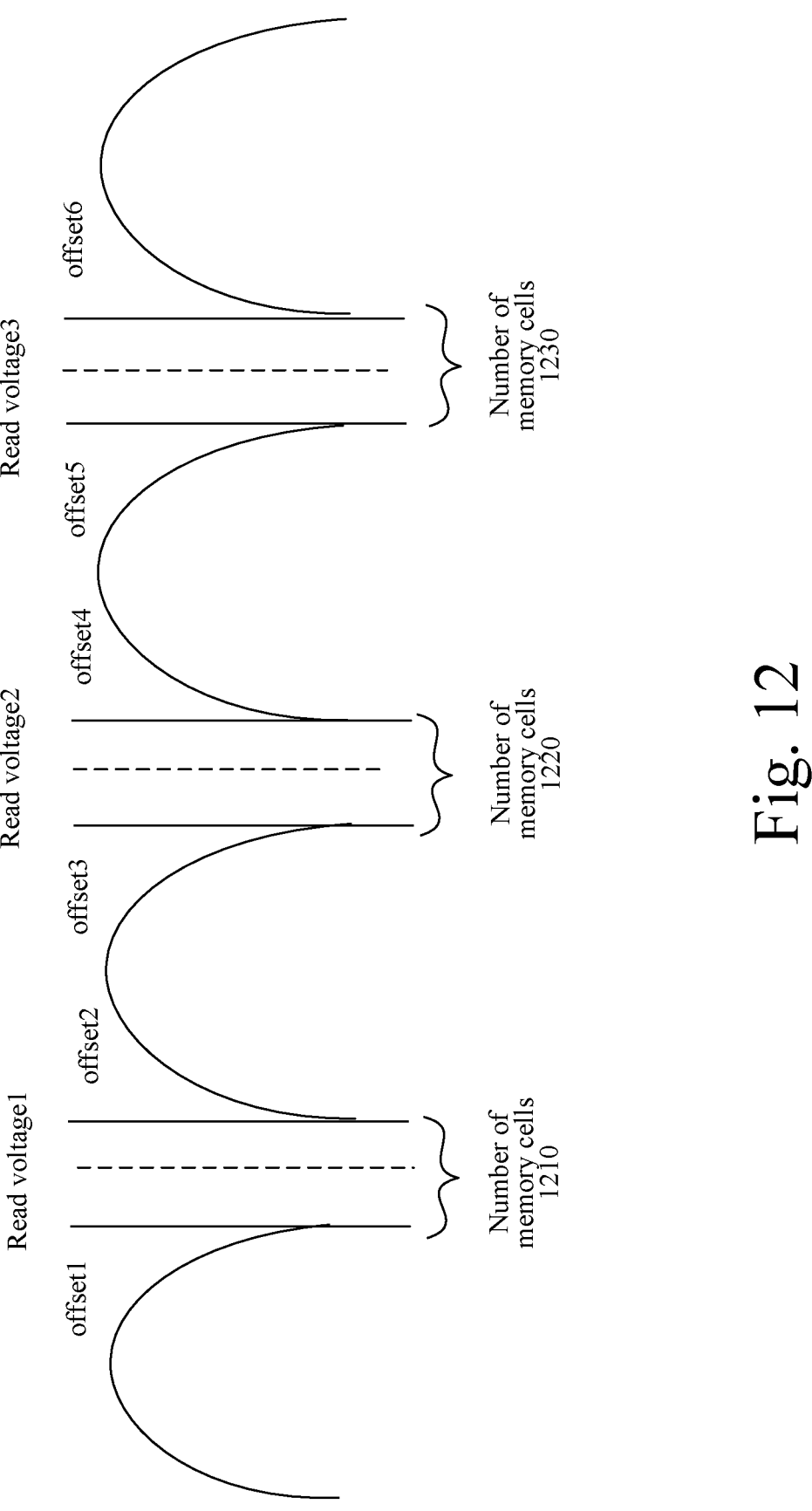
FIG. 12 is a schematic diagram of a verify solution provided based on the example shown in FIG. 11.

Referring to FIG. 12, 4 programmed states are obtained after the first program operation on the memory cells, and the read operation is performed on the memory cells through the preset read voltage 1, read voltage 2, and read voltage 3. Using the read voltage 1 as a default read level, the number 1210 of memory cells within a preset offset range of the read voltage 1 is read; using the read voltage 2 as a default read level, the number 1220 of memory cells within a preset offset range of the read voltage 2 is read; and using the read voltage 3 as a default read level, the number 1230 of memory cells within a preset offset range of the read voltage 3 is read.

In an example, determining the number of memory cells within the preset offset range means determining second memory cells reaching a threshold voltage within the preset offset range after the first program operation and determining the number of the second memory cells.

In an example, the fail bit count is determined based on the number of memory cells within the preset offset range of the default read level, and whether the first program operation on the memory cells meets the preset requirement is determined based on the fail bit count.

In some examples, one page of data is distributed in the various programmed states uniformly after the first programming. Taking 4-16 two-step programming as an example for illustration, one page of 16 KB data is distributed in 4 programmed states uniformly after the first program operation, where each programmed state corresponds to 4 KB data. That is, if the first program operation on the memory cells meets the preset requirement, the number of memory cells corresponding to each programmed state corresponds to 4 KB data, and threshold voltage distributions corresponding to the various programmed states are leveled. That is, whether the first program operation meets the preset requirement is determined based on the number of memory cells within the preset offset range corresponding to each preset read voltage.

At operation 8041, the method may include performing the second program operation on the memory cells in a case where the number of memory cells within the preset offset range of the default read level is less than or equal to a second preset number.

The second preset number is a preset value used for constraining the fail bit count. When the number of memory cells within the preset offset range of the default read level is less than or equal to the second preset number, it indicates that after the first program operation, a threshold voltage range of the programmed state corresponding to the preset read voltage has a small overlap with the preset offset range. That is, the fail bit count of the first program operation is small, thus determining that the first program operation on the memory cells meets the preset requirement.

Meeting the preset requirement means that the first program result obtained after the first program operation on the memory cells has few errors, in which case the second program operation can be performed.

As shown in FIG. 12, taking the one page of 16 KB data that yields 4 programmed states after the first programming as an example, after the first program operation on the memory cells, and using each of the preset read voltage 1, read voltage 2, and read voltage 3 as the default read level, reading is performed once respectively upon adding the offset voltage to the default read level and subtracting the offset voltage from the default read level, and the number of memory cells between two offset read levels, e.g., within the preset offset range, is calculated. And using the read voltage 1 as the default read level, the number 1210 of memory cells within the preset offset range of the read voltage 1 is determined; using the read voltage 2 as the default read level, the number 1220 of memory cells within the preset offset range of the read voltage 2 is determined; and using the read voltage 3 as the default read level, the number 1230 of memory cells within the preset offset range of the read voltage 3 is determined. After the 4 programmed states are obtained, the number of memory cells corresponding to each programmed state corresponds to 4 KB, and voltage intervals between the threshold voltages corresponding to the various programmed states are relatively uniform.

Typically, the number of memory cells within a voltage interval range should be 0. To avoid errors in the preset offset range per se, the second preset number is set to be close to 0. Schematically, the second preset number is set to 64 b.

In some examples, when the number of memory cells within the preset offset range is less than the second preset number, it indicates that the programmed states obtained after the first program operation have no or few errors, and therefore, the preset requirement is met.

In an example, when numbers of memory cells within respective preset offset ranges corresponding to the plurality of preset read voltages are less than or equal to the second preset number, it indicates that the first program operation meets the preset requirement; or when a sum of the numbers of memory cells within respective preset offset ranges corresponding to the plurality of preset read voltages is less than or equal to the second preset number, it indicates that the first program operation meets the preset requirement; or when an average of the numbers of memory cells within respective preset offset ranges corresponding to the plurality of preset read voltages is less than or equal to the second preset number, it indicates that the first program operation meets the preset requirement.

At operation 8042, in a case where the number of memory cells within the preset offset range of the default read level is greater than the second preset number, the method may include receiving error-corrected data obtained after error correction of a program result of the first program operation.

When the number of memory cells within the preset offset range of the default read level is greater than the second preset number, it indicates that after the first program operation, the threshold voltage range of the programmed state corresponding to the preset read voltage has a large overlap with the preset offset range. That is, the fail bit count of the first program operation is large, in which case the error correction processing is performed on the program result of the first program operation on the memory cells meets the preset requirement. That is, the error-corrected data obtained after the error correction of the program result of the first program operation is received from the memory interface.

Taking the one page of 16 KB data that yields 4 programmed states after the first programming as an example, after the first programming on the memory cells, using each of the preset read voltage 1, read voltage 2, and read voltage 3 as the default read level, the reading is performed once respectively upon adding the offset voltage to the default read level and subtracting the offset voltage from the default read level, and the number of memory cells between two offset read levels, e.g., within the preset offset range, is calculated. And using the read voltage 1 as the default read level, the number of memory cells within the preset offset range of the read voltage 1 is determined; using the read voltage 2 as the default read level, the number of memory cells within the preset offset range of the read voltage 2 is determined; and using the read voltage 3 as the default read level, the number of memory cells within the preset offset range of the read voltage 3 is determined. After the 4 programmed states are obtained, voltage intervals between the threshold voltages corresponding to the various programmed states are relatively uniform.

Typically, the number of memory cells within a voltage interval range should be 0. To avoid errors in the preset offset range per se, a second preset number is set to be close to 0. Schematically, the second preset number is set to 64 b.

In some examples, when the number of memory cells within the preset offset range is greater than the second preset number, this indicates that the programmed states obtained after the first program operation have many error bits. Thus, the error-corrected data obtained after the error correction of the program result of the first program operation is received.

In an example, when the numbers of memory cells within respective preset offset ranges corresponding to the plurality of preset read voltages are greater than the second preset number, the error correction of the program result of the first program operation is performed; or when the sum of the numbers of memory cells within respective preset offset ranges corresponding to the plurality of preset read voltages is greater than the second preset number, the error correction of the program result of the first program operation is performed; or when the average of the numbers of memory cells within respective preset offset ranges corresponding to the plurality of preset read voltages is greater than or equal to the second preset number, the error correction of the program result of the first program operation is performed.

That is, in the program method of the memory provided by the examples of the present disclosure, after the first program operation, the read operation is performed on the memory cells through the preset read voltage, so as to determine, according to the read result of the memory cells, whether the fail bit count of the memory cells meets the preset requirement after the first programming, and in the case where the preset requirement is met, the second program operation is performed on the memory cells without the error correction with ECC, thereby avoiding the impact of the complicated error correction with ECC process on the program efficiency, and improving the program efficiency on the basis of reducing the program error rate.

In the method provided by the examples, using the plurality of preset read voltages as the default read level, the number of memory cells within the preset offset range of the default read level is read, and whether the first programming on the memory cells meets the preset requirement is determined by comparing the number of memory cells with the second preset number, improving the efficiency of checking the first program operation on the memory cells and improving the program efficiency.

Figure 13:
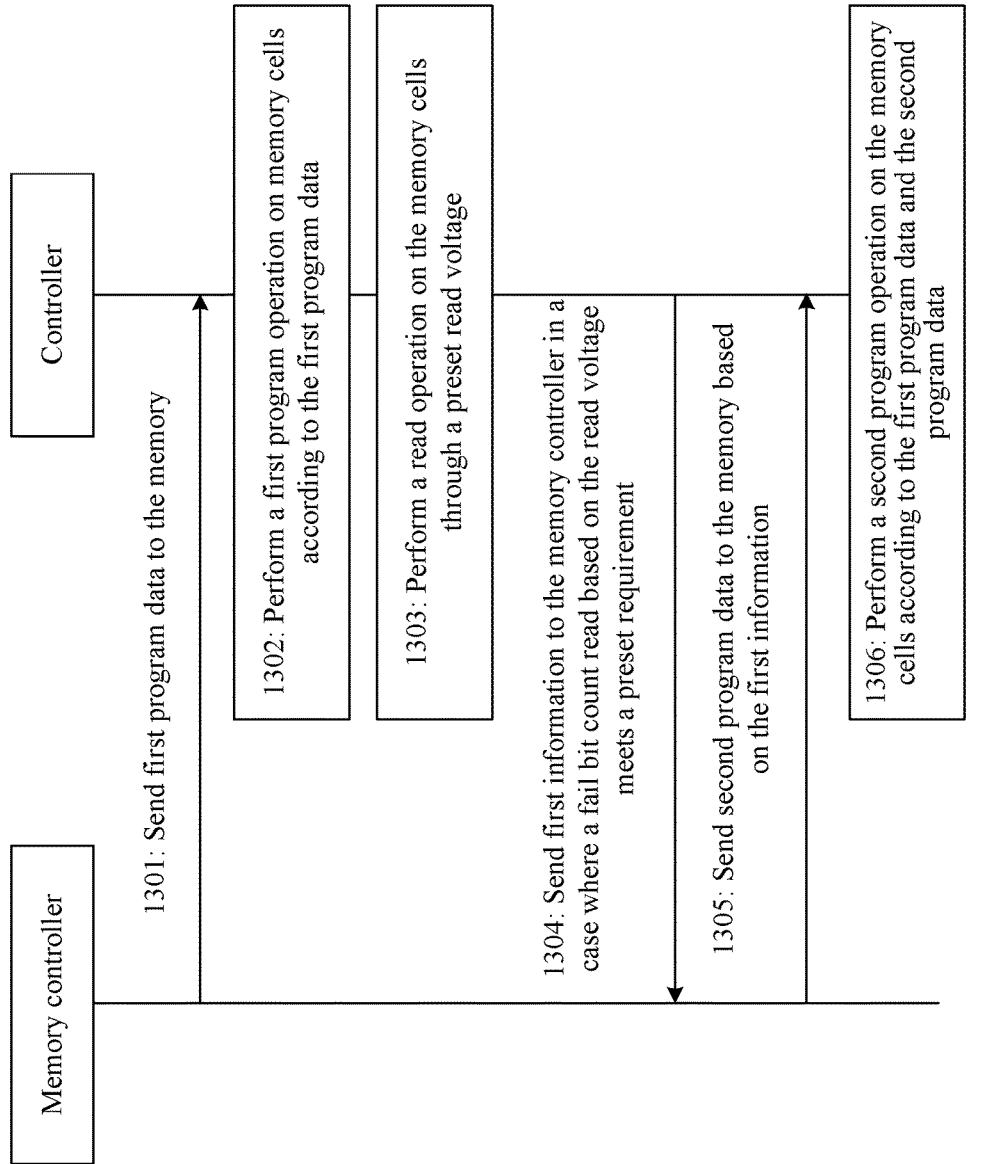
FIG. 13 is an interaction flow diagram of a program method of a memory, according to one example of the present disclosure.

FIG. 13 is a flow diagram of a program method of a memory provided by one example implementation of the present disclosure. Taking the method being applied to a memory system as an example for illustration, the memory system includes a memory controller and a memory, where the memory includes a memory array that includes memory cells. As shown in FIG. 13, the method includes the following operations.

At operation 1301, the memory controller sends first program data to the memory.

In the examples of the present disclosure, illustration is performed by taking the 4-16 two-step programming as an example, where the first program data is two pages of data used to instruct the memory to perform a first program operation, and after the first program operation, the memory programs the first program data into 4 storage states.

At operation 1302, the memory performs a first program operation on memory cells according to the first program data.

In some examples, the memory performs the first program operation on the memory cells according to the first program data to obtain n programmed states, n being a positive integer.

At operation 1303, the memory performs a read operation on the memory cells through a preset read voltage.

In an example, the read operation is performed on the memory cells through a plurality of preset read voltages, and whether the first program operation on the memory cells meets the preset requirement is determined based on the number of memory cells that is read through the plurality of preset read voltages.

In some examples, ways to read based on the preset read voltages include at least one of the following ways:

1) reading the number of memory cells between two adjacent preset read voltages of the plurality of preset read voltages, determining the fail bit count based on the number of memory cells between the two adjacent preset read voltages, and based on the fail bit count, determining whether the first program operation on the memory cells meets the preset requirement;

when the difference between the number of memory cells between two adjacent preset read voltages and the first preset number is less than or equal to the first difference threshold, determining that the first program operation on the memory cells meets the preset requirement, and performing the second program operation on the memory cells; in the case where the difference between the number of memory cells between two adjacent preset read voltages and the first preset number is greater than the first difference threshold, receiving the error-corrected data obtained after the error correction of the program result of the first program operation; or 2) using the plurality of preset read voltages as the default read level, reading the number of memory cells within the preset offset range of the default read level; determining the fail bit count based on the number of memory cells within the preset offset range of the default read level, and based on the fail bit count, determining whether the first program operation on the memory cells meets the preset requirement.

In the case where the number of memory cells within the preset offset range of the default read level is less than or equal to the second preset number, it is determined that the first program operation on the memory cells meets the preset requirement, and the second program operation is performed on the memory cells; when the number of memory cells within the preset offset range of the default read level is greater than the second preset number, the error-corrected data obtained after the error correction of the program result of the first program operation is received.

At operation 1304, the memory sends first information to the memory controller in a case where a fail bit count read based on the read voltage meets a preset requirement.

The first information is to indicate that the first program operation on the memory cells meets the preset requirement; or the first information is to instruct the memory controller to transmit the second program data.

The first information is information sent by the memory to the memory controller in the case where the first program operation on the memory cells meets the preset requirement.

At operation 1305, the memory controller sends second program data to the memory based on the first information.

In some examples, the memory controller sends the second program data to the memory separately based on the first information; or the memory controller sends the first program data and the second program data together to the memory based on the first information.

At operation 1306, the memory performs a second program operation on the memory cells according to the first program data and the second program data.

In some examples, m programmed states are obtained after the memory performs the second program operation on the memory cells according to the first program data and the second program data, n≤m.

In some examples, in the case where the fail bit count read based on the read voltage does not meet the preset requirement, the memory sends the program result of the first program data to the memory controller. The memory controller performs the error correction with ECC on the program result, and sends the first program data after the error correction with the ECC and the second program data to the memory. The memory performs the second program operation on the memory cells according to the first program data after the error correction with the ECC and the second program data to obtain the m programmed states.

That is, in the memory system provided by the examples of the present disclosure, after the first program operation, the read operation is performed on the memory cells through the preset read voltage, so as to determine, according to the read result of the memory cells, whether the fail bit count of the memory cells meets the preset requirement after the first program operation, and in the case where the preset requirement is met, the second program operation is performed on the memory cells without the error correction with ECC, thereby avoiding the impact of the complicated error correction with ECC process on the program efficiency, and improving the program efficiency on the basis of reducing the program error rate.

Figure 14:
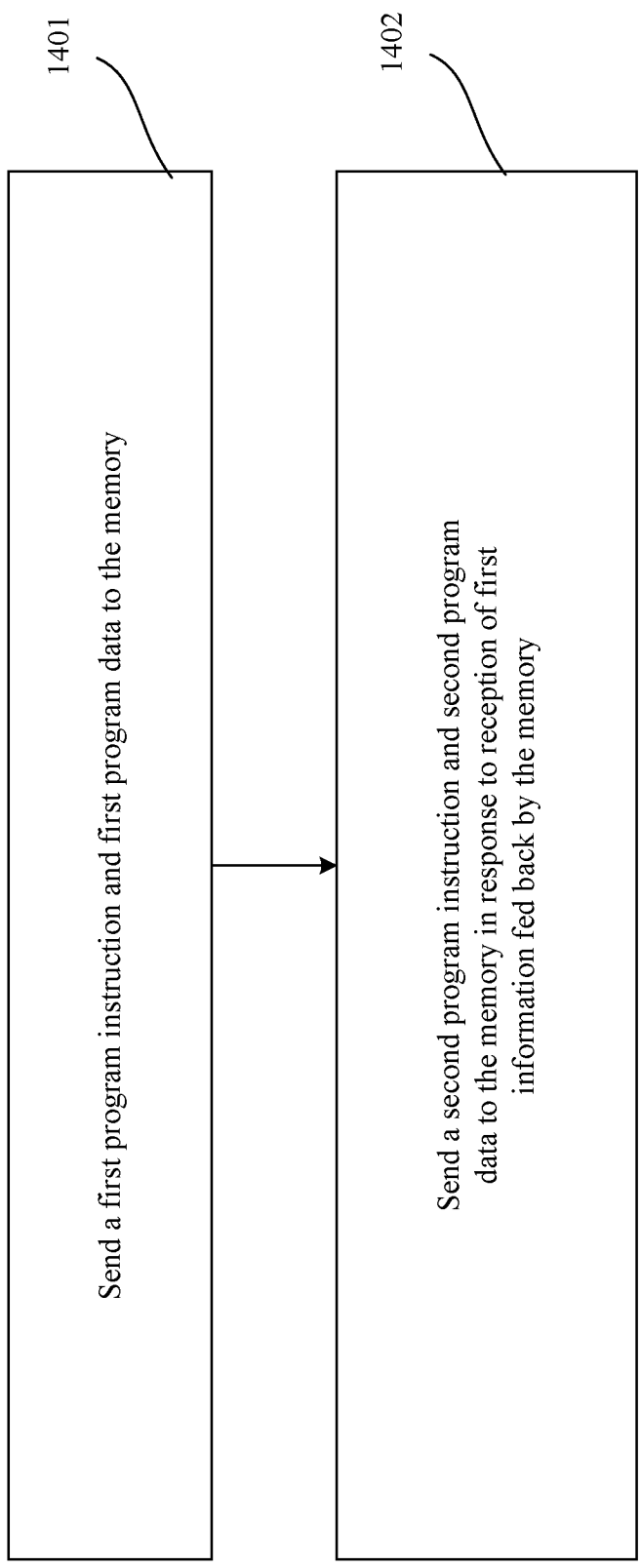
FIG. 14 is a flow diagram of a program method of a memory, according to one example of the present disclosure.

FIG. 14 is a flow diagram of a program method of a memory provided by one example implementation of the present disclosure. Taking the method being executed by a memory controller as an example for illustration, the memory system includes a memory controller and a memory, where the memory includes a memory array that includes memory cells. As shown in FIG. 14, the method includes the following operations.

At operation 1401, the method may include sending a first program instruction and first program data to the memory.

The first program instruction is to instruct the memory to perform a first program operation on the first program data to obtain n programmed states, n being a positive integer.

At operation 1402, the method may include sending a second program instruction and second program data to the memory in response to reception of first information fed back by the memory.

The second program instruction is to instruct the memory to perform a second program operation on the first program data and the second program data to obtain m programmed states, n≤m, and the first information is to indicate that the program result of the first program operation of the memory meets the preset requirement.

In an example, in response to reception of the program result of the first program data and second information fed back by the memory, the error correction with ECC is performed on the program result to obtain error-corrected first program data. A third program instruction, the second program data, and the error-corrected first program data are sent to the memory, where the third program instruction is to instruct the memory to perform the second program operation on the error-corrected first program data and the second program data to obtain the m programmed states.

In an example, in the program method of the memory, a process for an input/output interface of the memory includes the following process: receiving the first program instruction and the first program data that are sent by the memory controller; transmitting the first program instruction and the first program data to the memory, where the first program instruction is to instruct the memory to perform the first program operation on the first program data to obtain n programmed states, n being a positive integer; receiving the first information fed back by the memory, where the first information is to indicate that the first program operation of the memory meets the preset requirement; transmitting the first information to the memory controller and receiving the second program instruction and the second program data that are sent by the memory controller; and transmitting the second program instruction and the second program data to the memory, where the second program instruction is to instruct the memory to perform the second program operation on the first program data and the second program data to obtain m programmed states, n≤m.

In some examples, the input/output interface of the memory receives the program result of the first program data and the second information fed back by the memory, where the second information is to instruct to perform the error correction of the program result of the memory. The input/output interface of the memory sends the second information and the program result of the first program data to the memory controller, receives the third program instruction, the second program data, and the error-corrected first program data that are sent by the memory controller, and sends the third program instruction, the second program data, and the error-corrected first program data to the memory, where the third program instruction is to instruct the memory to perform the second program operation on the error-corrected first program data and the second program data to obtain m programmed states.

That is, in the program method of the memory provided by the examples of the present disclosure, after the first program operation, the read operation is performed on the memory cells through the preset read voltage, so as to determine, according to the read result of the memory cells, whether the fail bit count of the memory cells meets the preset requirement after the first program operation, and in the case where the preset requirement is met, the second program operation is performed on the memory cells without the error correction with ECC, avoiding the impact of the complicated error correction with ECC process on the program efficiency, and improving the program efficiency on the basis of reducing the program error rate.

Figure 15:
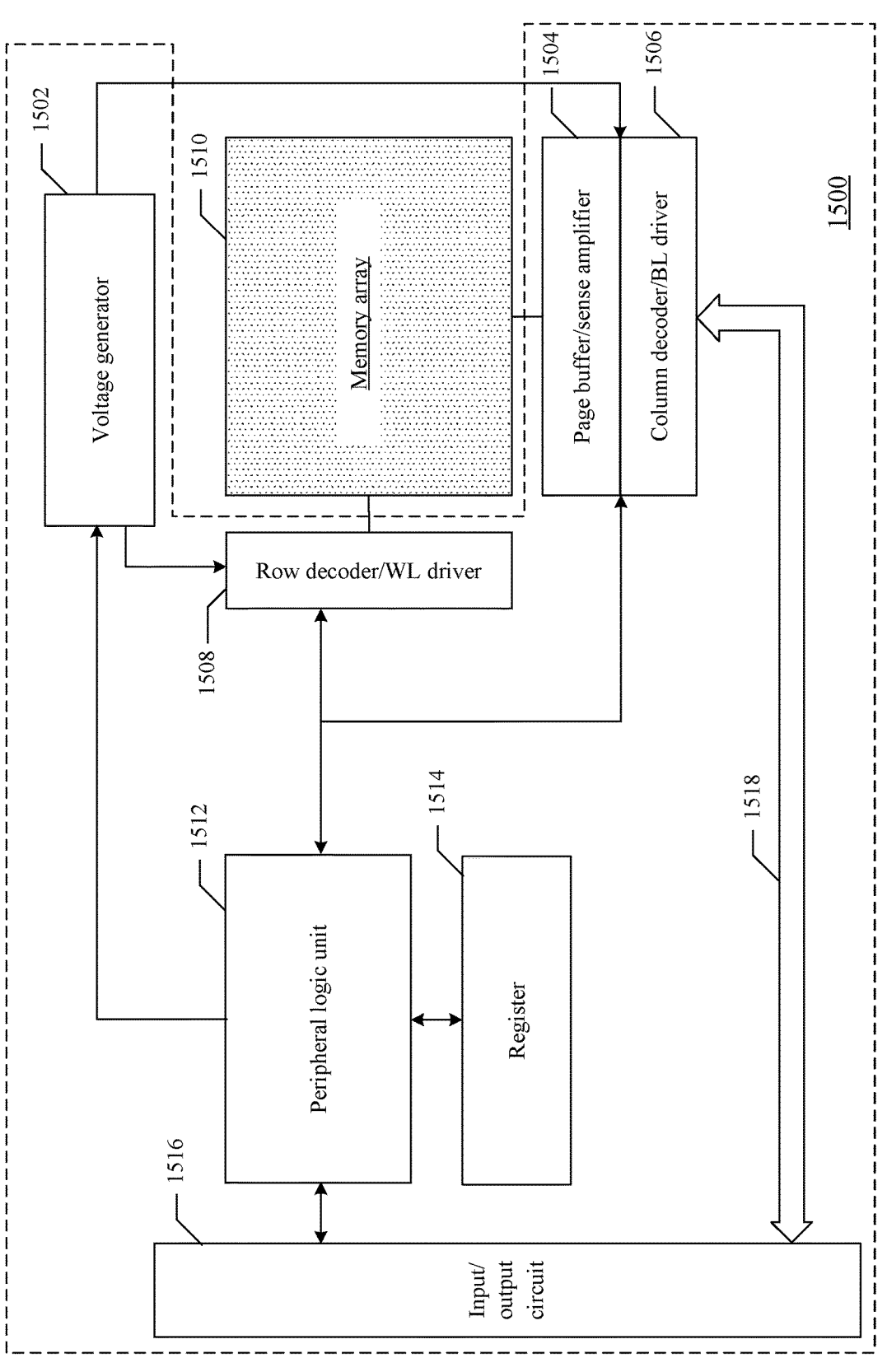
FIG. 15 is a schematic structural diagram of a memory, according to one example of the present disclosure.

FIG. 15 is a schematic structural diagram of a memory provided by examples of the present disclosure. As shown in FIG. 15, the memory includes a peripheral circuit 1500 and a memory array 1510.

The peripheral circuit 1500 is configured to write and read data to and from the memory array 1510.

The peripheral circuit 1500 includes a voltage generator 1502, a page buffer/sense amplifier 1504, a column decoder/bit line (BL) driver 1506, a row decoder/word line (WL) driver 1508, a peripheral logic unit 1512, a register 1514, an input/output circuit 1516, and a data bus 1518. It is understood that in some examples, an additional peripheral circuit not shown in FIG. 15 may be included as well.

The page buffer/sense amplifier 1504 may be configured to read and program (write) data from and to the memory cell array 1510 according to control signals from the peripheral logic unit 1512. In one example, the page buffer/sense amplifier 1504 may store one page of program data (write data) to be programmed into one page of the memory cell array 1510. In another example, the page buffer/sense amplifier 1504 may perform program verify operations to ensure that the data has been properly programmed into the memory cells coupled to the selected word line. In yet another example, the page buffer/sense amplifier 1504 may also sense a low power signal from the bit line that represents data bits stored in the memory cells, and amplify a small voltage swing to a recognizable logic level in a read operation.

The column decoder/bit line driver 1506 may be configured to be controlled by the peripheral logic unit 1512 and select one or more NAND memory strings by applying bit line voltages generated from the voltage generator 1502.

The row decoder/word line driver 1508 may be configured to be controlled by the peripheral logic unit 1512 and select/unselect a block of the memory cell array 1510 and select/unselect a word line of the block. The row decoder/word line driver 1508 may be further configured to drive the word line using a word line voltage (VWL) generated from the voltage generator 1502. In some implementations, the row decoder/word line driver 1508 may also select/unselect and drive a source select gate line and a drain select gate line. Schematically, the row decoder/word line driver 1508 is configured to perform erase operations on the memory cells coupled to (one or more) selected word lines.

The voltage generator 1502 may be configured to be controlled by the peripheral logic unit 1512 and generate a word line voltage (such as a read voltage, a program voltage, a pass voltage, a local voltage, and a verify voltage, etc.), a bit line voltage, and a source line voltage to be supplied to the memory cell array 1510.

The peripheral logic unit 1512 may be coupled to each peripheral circuit described above and configured to control the operations of each peripheral circuit. The peripheral logic unit 1512 includes a control circuit as shown in FIG. 15 above.

The register 1514 may be coupled to the peripheral logic unit 1512 and include a state register, a command register, and an address register for storing state information, command operation codes (OP codes), and command addresses for controlling the operations of each peripheral circuit. The input/output circuit 1516 may be coupled to the peripheral logic unit 1512, and act as a control buffer to buffer and relay control commands received from a host (not shown) to the peripheral logic unit 1512 and state information received from the peripheral logic unit 1512 to the host. The input/output circuit 1516 may also be coupled to the column decoder/bit line driver 1506 via a data bus 1518 and act as a data input/output interface and a data buffer to buffer and relay the data to and from the memory cell array 1510.

It is to be emphasized that the peripheral circuit 1500 is configured to perform the program method of the memory provided by the examples of the present disclosure on a selected memory cell row in a plurality of memory cell rows.

Figure 16:
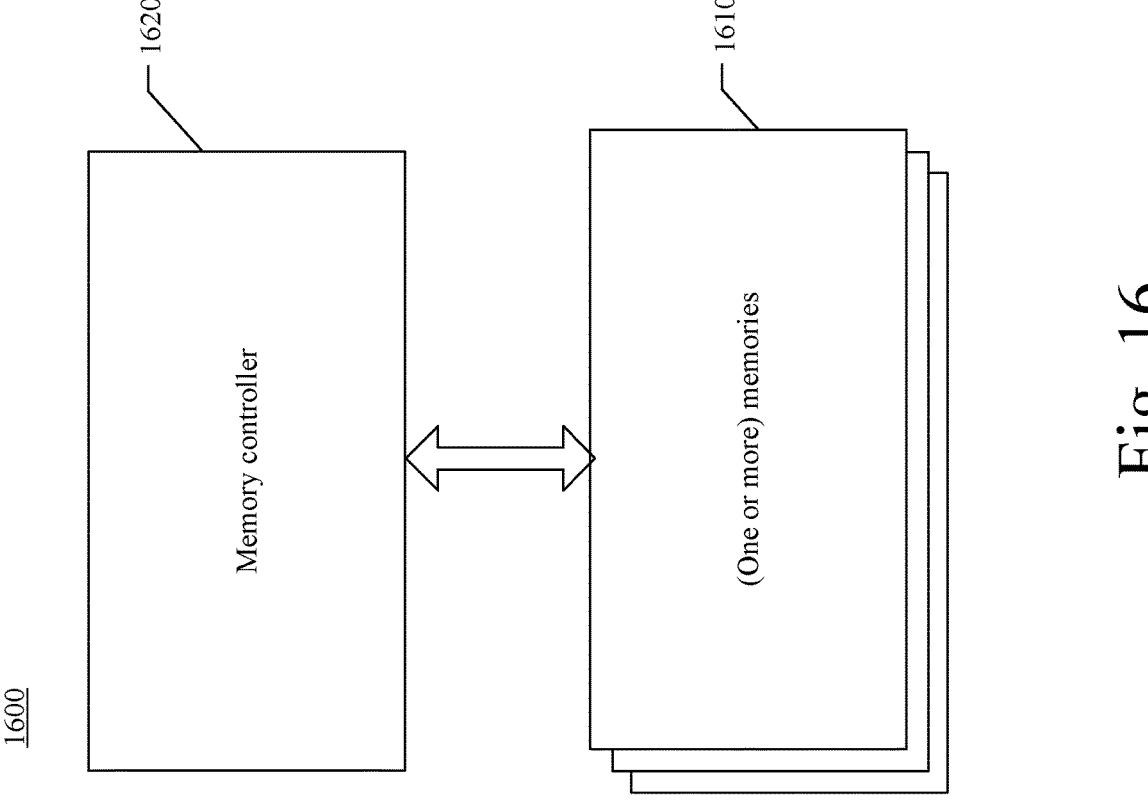
FIG. 16 is a schematic structural diagram of a memory system, according to one example of the present disclosure.

FIG. 16 is a structural block diagram of a memory system provided by one example implementation of the present disclosure. As shown in FIG. 16, the memory system 1600 includes: one or more memories 1610 and a memory controller 1620 coupled to the one or more memories 1610 and configured to control the one or more memories 1610.

The memory system 1600 may be a mobile phone, a desktop computer, a laptop computer, a tablet, a vehicle computer, a gaming console, a printer, a positioning apparatus, a wearable electronic apparatus, a smart sensor, a virtual reality (VR) apparatus, an augmented reality (AR) apparatus, or any other suitable electronic apparatuses having storages therein.

In an example, the memory system 1600 may include a host and a memory subsystem, where the memory subsystem has one or more memories 1610 and the memory controller 1620. The host may be a processor (e.g., a Central Processing Unit (CPU)) or a System on Chip (SOC), such as an Application Processor (AP)) of the electronic apparatus. The host may be configured to send data to the memories 1610. Alternatively, the host may be configured to receive data from the memories 1610.

According to some implementations, the memory controller 1620 is further coupled to the host. The memory controller 1620 can manage the data stored in the memories 1610 and communicate with the host.

In some implementations, the memory controller 1620 is designed for operating in a low duty-cycle environment, e.g., a Secure Digital (SD) card, a Compact Flash (CF) card, a Universal Serial Bus (USB) flash drive, or other media for use in electronic apparatuses, such as a personal computer, a digital camera, and a mobile phone, etc.

In some implementations, the memory controller 1620 is designed for operating in a high duty-cycle environment Solid State Disk (SSD) or embedded Multi Media Card (eMMC) used as a data storage for a mobile apparatus such as a smartphone, a tablet, and a laptop computer, etc., and an enterprise memory array.

The memory controller 1620 may be configured to control operations of the one or more memories 1610, such as read, erase, and program operations. The memory controller 1620 may be further configured to manage various functions with respect to data stored or to be stored in the one or more memories 1610, including, but not limited to bad-block management, garbage collection, logical-to-physical address translation, and wear leveling, etc. In some implementations, the memory controller 1620 is further configured to process an error correction code (ECC) with respect to the data read from or written to the one or more memories 1610.

The memory controller 1620 may further perform any other suitable functions, e.g., formatting the one or more memories 1610. The memory controller 1620 may communicate with an external apparatus according to an example communication protocol.

The memory controller 1620 and the one or more memories 1610 can be integrated into various types of memory devices, e.g., be included in the same package (such as a Universal Flash Storage (UFS) package or an eMMC package). That is, the memory system 1600 can be implemented and packaged into different types of end electronic products.

Schematically, the memory controller 1620 and a single memory (e.g., one memory of the one or more memories 610) may be integrated into a memory card. The memory card may include a PC card (Personal Computer Memory Card International Association (PCMCIA)), a CF card, a Smart Media (SM) card, a memory stick, a Multi-media card, an SD card, and a UFS, etc. The memory card may further include a memory card connector coupling the memory card with the host.

Schematically, the memory controller 1620 and the plurality of memories 1610 may be integrated into a solid state disk (SSD). In some implementations, a storage capacity and/or an operation speed of the solid state disk are greater than those of the memory card.

It can be understood that the memory controller 1620 may perform the program method of the memory provided by any one of the examples of the present disclosure.

Examples of the present disclosure provide a control circuit which includes a programmable logic circuit and/or a program instruction, where the control circuit may be configured to implement the program method of the memory provided by the above examples of the present disclosure. A program operation includes coarse programming and fine programming.

Schematically, as shown in FIG. 15, the memory includes the peripheral circuit 1500 and the memory array 1510, where the memory array includes memory cells.

The peripheral circuit 1500 is configured to perform a first program operation on the memory cells.

The peripheral circuit 1500 is further configured to perform a read operation on the memory cells through a preset read voltage.

The peripheral circuit 1500 is further configured to perform a second program operation on the memory cells in a case where a fail bit count (FBC) read based on the read voltage meets a preset requirement.

In an example, the peripheral circuit 1500 is further configured to perform the read operation on the memory cells through a plurality of preset read voltages.

The peripheral circuit 1500 is further configured to read the fail bit count based on the plurality of preset read voltages.

In an example, the peripheral circuit 1500 is further configured to read the number of memory cells between two adjacent preset read voltages of the plurality of preset read voltages.

The peripheral circuit 1500 is further configured to determine the fail bit count based on the number of memory cells between the two adjacent preset read voltages.

In an example, the peripheral circuit 1500 is further configured to perform the second program operation on the memory cells in a case where a difference between the number of memory cells between two adjacent preset read voltages and a first preset number is less than or equal to a first difference threshold.

The peripheral circuit 1500 is further configured to, in a case where the difference between the number of memory cells between two adjacent preset read voltages and the first preset number is greater than the first difference threshold, receive error-corrected data obtained after error correction of a program result of the first program operation.

In an example, the peripheral circuit 1500 is further configured to, using the plurality of preset read voltages as a default read level, read the number of memory cells within a preset offset range of the default read level.

The peripheral circuit 1500 is further configured to determine the fail bit count based on the number of memory cells within the preset offset range of the default read level.

In an example, the peripheral circuit 1500 is further configured to perform the second program operation on the memory cells in a case where the number of memory cells within the preset offset range of the default read level is less than or equal to a second preset number.

The peripheral circuit 1500 is further configured to, in a case where the number of memory cells within the preset offset range of the default read level is greater than the second preset number, receive error-corrected data obtained after error correction of a program result of the first program operation.

In an example, the peripheral circuit 1500 is further configured to receive first program data from a memory interface, and perform the first program operation on the memory cells according to the first program data to obtain n programmed states, n being a positive integer.

The peripheral circuit 1500 is further configured to, in the case where the fail bit count read based on the read voltage meets the preset requirement, receive second program data from the memory interface, and perform the second program operation on the memory cells according to the first program data and the second program data to obtain m programmed states, n≤m.

In an example, the peripheral circuit 1500 is further configured to, in a case where the fail bit count read based on the read voltage does not meet the preset requirement, receive the first program data after error correction with memory error correction code (ECC) from the memory interface.

The peripheral circuit 1500 is further configured to receive the second program data from the memory interface, and perform the second program operation on the memory cells according to the first program data after error correction with ECC and the second program data to obtain the m programmed states.

In an example, the memory is the NAND memory.

Examples of the present disclosure provide an electronic apparatus, which includes: one or more memories as described in any one of the above examples, and a memory controller coupled to the memories and configured to control the memories.

Examples of the present disclosure provide a computer-readable storage medium which stores instructions therein, which, when run on the control circuit, implement the program method of the memory provided by the above examples of the present disclosure.

In the present disclosure, the terms "first" and "second" are only for the purpose of description, and cannot be construed as indicating or implying relative importance. The term "at least one" means one or more, and the term "a plurality of" means two or more, unless otherwise defined clearly.

The term "and/or" in the present disclosure is only an association relationship for describing associated objects, and indicates that three relationships may exist, for example, A and/or B may represent the presence of A alone, the presence of both A and B, and the presence of B alone. In addition, the character "/" herein generally indicates that associated objects before and after it have a relationship indicated by "or".

The above descriptions are only example implementations of the present disclosure, and are not used to limit the present disclosure. Any amendments, equivalent substitutions, improvements and the like made within the spirit and principle of the present disclosure shall be encompassed within the protection scope of the present disclosure.

What is claimed is:

1. A memory, comprising:

a memory array comprising memory cells; and a peripheral circuit configured to:

perform a first program operation on the memory cells;

perform a read operation on the memory cells;

determine a program result of the first program operation, corresponding to a fail bit count (FBC) read, by one of:

determining the program result based on a first comparison of a first preset number with a difference in a first number of memory cells between two adjacent preset read voltages of a plurality of preset read voltages, wherein the first comparison, between the first preset number and the difference, determines whether error correction of the program result is performed and error-corrected data is received; or determining the program result based on a second comparison of a second preset number with a second number of memory cells within a preset offset range of a default read level, the plurality of preset read voltages being configured as the default read level, wherein the second comparison, between the second preset number and the second number, determines whether the error correction of the program result is performed and the error-corrected data is received; and when the fail bit count (FBC) read corresponding to the program result meets a preset requirement, perform a second program operation on the memory cells.

2. The memory of claim 1, wherein the peripheral circuit is further configured to:

perform the read operation on the memory cells through the plurality of preset read voltages; and read the fail bit count based on the plurality of preset read voltages.

3. The memory of claim 2, wherein the peripheral circuit is further configured to:

read the first number of memory cells between the two adjacent preset read voltages of the plurality of preset read voltages; and determine the fail bit count based on the first number of memory cells between the two adjacent preset read voltages.

4. The memory of claim 3, wherein the peripheral circuit is further configured to:

when the difference between the first number of memory cells between the two adjacent preset read voltages and the first preset number is less than or equal to a first difference threshold, perform the second program operation on the memory cells; and when the difference between the first number of memory cells between the two adjacent preset read voltages and the first preset number is greater than the first difference threshold, receive the error-corrected data obtained after the error correction of the program result of the first program operation.

5. The memory of claim 2, wherein the peripheral circuit is further configured to:

using the plurality of preset read voltages as the default read level, read the second number of memory cells within the preset offset range of the default read level; and determine the fail bit count based on the second number of memory cells within the preset offset range of the default read level.

6. The memory of claim 5, wherein the peripheral circuit is further configured to:

when the second number of memory cells within the preset offset range of the default read level is less than or equal to the second preset number, perform the second program operation on the memory cells; and when the second number of memory cells within the preset offset range of the default read level is greater than the second preset number, receive the error-corrected data obtained after the error correction of the program result of the first program operation.

7. The memory of claim 1, wherein the peripheral circuit is further configured to:

receive first program data from a memory interface, and perform the first program operation on the memory cells according to the first program data to obtain n programmed states, n being a positive integer; and when the fail bit count read corresponding to the program result meets the preset requirement, receive second program data from the memory interface, and perform the second program operation on the memory cells according to the first program data and the second program data to obtain m programmed states, where n≤m.

8. The memory of claim 7, wherein the peripheral circuit is further configured to:

when the fail bit count read corresponding to the program result does not meet the preset requirement, receive the first program data after error correction with memory error correction code (ECC) from the memory interface; and receive the second program data from the memory interface, and perform the second program operation on the memory cells according to the first program data after the error correction with the ECC and the second program data to obtain the m programmed states.

9. The memory of claim 1, wherein the peripheral circuit is further configured to:

determine the first number of memory cells between the two adjacent preset read voltages of the plurality of preset read voltages; and when the difference in the first number of memory cells between the two adjacent preset read voltages and the first preset number is less than or equal to a first difference threshold, perform the second program operation on the memory cells.

10. The memory of claim 1, wherein the peripheral circuit is further configured to:

determine the second number of memory cells within the preset offset range of the default read level; and when the second number of memory cells within the preset offset range of the default read level is less than or equal to the second preset number, perform the second program operation on the memory cells.

11. A memory system, comprising:

a memory comprising a memory array that includes memory cells; and a memory controller configured to send first program data to the memory;

wherein the memory is configured to:

perform a first program operation on the memory cells according to the first program data;

perform a read operation on the memory cells;

determine a program result of the first program operation, corresponding to a fail bit count (FBC) read, by one of:

determining the program result based on a first comparison of a first preset number with a difference in a first number of memory cells between two adjacent preset read voltages of a plurality of preset read voltages, wherein the first comparison, between the first preset number and the difference, determines whether error correction of the program result is performed and error-corrected data is received; or determining the program result based on a second comparison of a second preset number with a second number of memory cells within a preset offset range of a default read level, the plurality of preset read voltages being configured as the default read level, wherein the second comparison, between the second preset number and the second number, determines whether the error correction of the program result is performed and the error-corrected data is received; and when the fail bit count read corresponding to the program result meets a preset requirement, send first information to the memory controller;

the memory controller is further configured to receive the first information and send second program data to the memory; and the memory is further configured to perform a second program operation on the memory cells according to the first program data and the second program data.

12. The memory system of claim 11, wherein the memory is further configured to:

perform the read operation on the memory cells through the plurality of preset read voltages; and read the fail bit count based on the plurality of preset read voltages.

13. The memory system of claim 12, wherein the memory is further configured to:

read the first number of memory cells between the two adjacent preset read voltages of the plurality of preset read voltages; and determine the fail bit count based on the first number of memory cells between the two adjacent preset read voltages.

14. The memory system of claim 13, wherein the memory is further configured to:

when the difference between the first number of memory cells between the two adjacent preset read voltages and the first preset number is less than or equal to a first difference threshold, perform the second program operation on the memory cells; and when the difference between the first number of memory cells between the two adjacent preset read voltages and the first preset number is greater than the first difference threshold, receive the error-corrected data obtained after the error correction of the program result of the first program operation.

15. The memory system of claim 12, wherein the memory is further configured to:

using the plurality of preset read voltages as the default read level, read the second number of memory cells within the preset offset range of the default read level; and determine the fail bit count based on the second number of memory cells within the preset offset range of the default read level.

16. The memory system of claim 15, wherein the memory is further configured to:

when the second number of memory cells within the preset offset range of the default read level is less than or equal to the second preset number, perform the second program operation on the memory cells; and when the second number of memory cells within the preset offset range of the default read level is greater than the second preset number, receive the error-corrected data obtained after the error correction of the program result of the first program operation.

17. The memory system of claim 11, wherein:

the memory is further configured to, when the fail bit count read corresponding to the program result does not meet the preset requirement, send the program result of the first program data to the memory controller;

the memory controller is further configured to perform error correction with ECC on the program result, and send the first program data after the error correction with the ECC and the second program data to the memory; and the memory is further configured to perform the second program operation on the memory cells according to the first program data after the error correction with the ECC and the second program data.

18. A method of programming a memory, comprising:
performing a first program operation on memory cells;
performing a read operation on the memory cells through a plurality of preset read voltages; and when a fail bit count read based on a program result of the first program operation that the plurality of preset read voltages meets a preset requirement, performing a second program operation on the memory cells, comprising:

based on a difference in a number of memory cells between two adjacent preset read voltages of the plurality of preset read voltages and a first preset number, determining whether to perform the second program operation on the memory cells, wherein a comparison, between the first preset number and the difference, determines whether error correction of the program result is performed and error-corrected data is received.

19. The method of claim 18, further comprising:
when the difference in the number of memory cells between the two adjacent preset read voltages and the first preset number is greater than a first difference threshold, receiving the error-corrected data obtained after the error correction of the program result of the first program operation.

20. The method of claim 18, wherein performing the read operation on the memory cells through the plurality of preset read voltages comprises:

using the plurality of preset read voltages as a default read level, reading a number of memory cells within a preset offset range of the default read level.

* * * * *